(12) United States Patent
Komljenovic et al.

(10) Patent No.: US 9,667,026 B2
(45) Date of Patent: May 30, 2017

(54) OPTICAL-COUPLER BASED MODULATION-AVERAGING STRUCTURES FOR SELF-SEEDED COLORLESS WDM-PON

(71) Applicants: Tin Komljenovic, Zagreb (HR); Dubravko Babic, Milpitas, CA (US); Zvonimir Sipus, Zagreb (HR)

(72) Inventors: Tin Komljenovic, Zagreb (HR); Dubravko Babic, Milpitas, CA (US); Zvonimir Sipus, Zagreb (HR)

(73) Assignee: University of Zagreb, Zagreb (HR)

( * ) Notice: Subject to any disclaimer, the term of this patent is extended or adjusted under 35 U.S.C. 154(b) by 50 days.

(21) Appl. No.: 14/841,710

(22) Filed: Sep. 1, 2015

(65) Prior Publication Data
US 2017/0063022 A1    Mar. 2, 2017

(51) Int. Cl.
| | |
|---|---|
| H04J 14/00 | (2006.01) |
| H01S 3/10 | (2006.01) |
| H04Q 11/00 | (2006.01) |
| G02B 6/28 | (2006.01) |
| G02B 6/27 | (2006.01) |
| G02B 6/12 | (2006.01) |
| G02B 6/293 | (2006.01) |
| H04B 10/00 | (2013.01) |

(52) U.S. Cl.
CPC ...... *H01S 3/10092* (2013.01); *G02B 6/12019* (2013.01); *G02B 6/2766* (2013.01); *G02B 6/2804* (2013.01); *G02B 6/2861* (2013.01); *G02B 6/2938* (2013.01); *H04Q 11/0067* (2013.01); *H04Q 2011/0032* (2013.01)

(58) Field of Classification Search
CPC ...... H04J 14/02; H04J 14/0282; H04J 14/023; H04J 14/0235; H04J 14/0242; H04J 14/0249
See application file for complete search history.

(56) References Cited

U.S. PATENT DOCUMENTS

| | | | | |
|---|---|---|---|---|
| 2012/0020616 A1* | 1/2012 | Babie | .............. | H04J 14/02 385/27 |
| 2014/0029083 A1* | 1/2014 | Komljenovic | .......... | H01S 5/041 359/341.3 |

* cited by examiner

*Primary Examiner* — Daniel Dobson
(74) *Attorney, Agent, or Firm* — Shalini Venkatesh

(57) ABSTRACT

A connected optical waveguide structure comprises n four-port optical couplers, where n is greater than one; and n waveguide loops, each loop having a corresponding perimeter; wherein each of the n perimeters is different from each of the other n−1 perimeters. In one embodiment, for any pair of the n loops, the ratio of the larger perimeter to the smaller perimeter is greater than five halves (5/2).

9 Claims, 11 Drawing Sheets

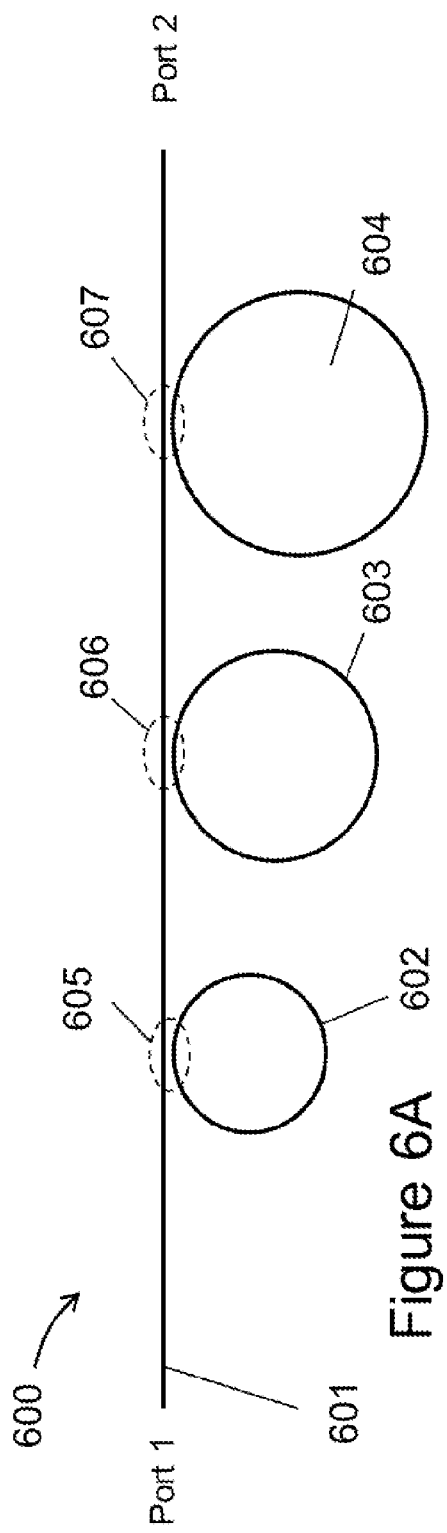
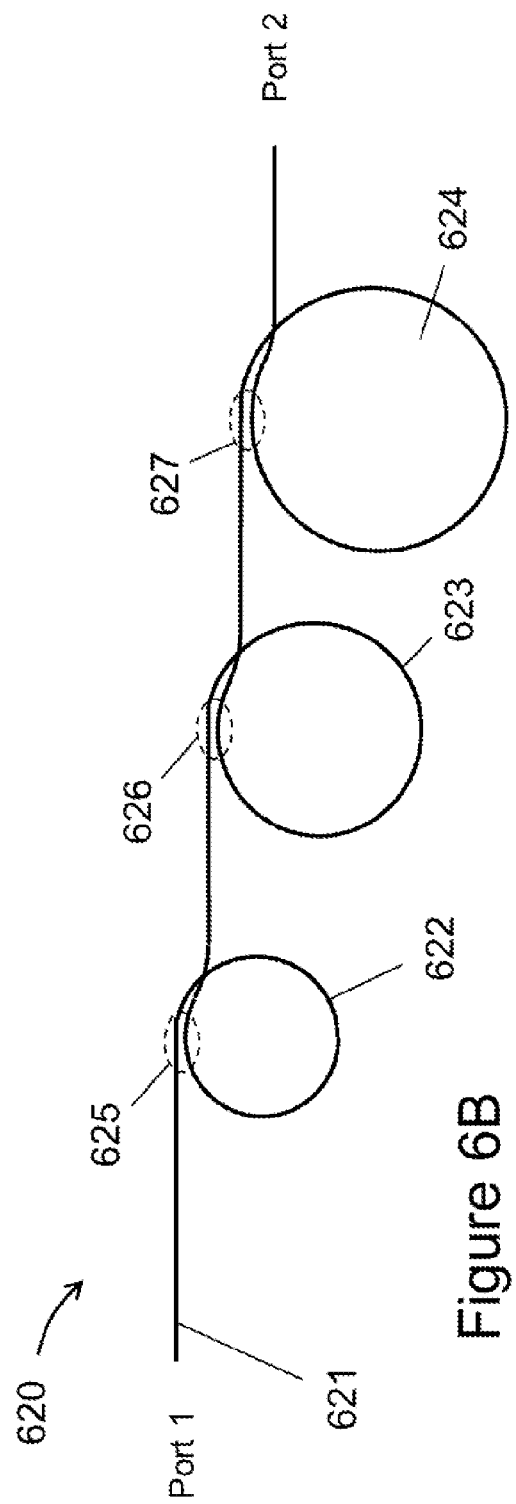

| Total length | a = 0 | | | | a = 0.1 | | | | a = 0.2 | | | |
|---|---|---|---|---|---|---|---|---|---|---|---|---|
| | Ring 1 | Ring 2 | Ring 3 | NGP | Ring 1 | Ring 2 | Ring 3 | NGP | Ring 1 | Ring 2 | Ring 3 | NGP |
| 50 | 4 | 5 | 41 | 0.08467 | 4 | 5 | 41 | 0.10373 | 4 | 5 | 41 | 0.12900 |
| 51 | 1 | 9 | 41 | 0.08423 | 1 | 9 | 41 | 0.10342 | 1 | 9 | 41 | 0.12881 |
| 52 | 2 | 7 | 43 | 0.08413 | 2 | 7 | 43 | 0.10341 | 2 | 7 | 43 | 0.12884 |
| 53 | 1 | 8 | 44 | 0.08390 | 1 | 8 | 44 | 0.10327 | 1 | 8 | 44 | 0.12876 |
| 54 | 1 | 8 | 45 | 0.08376 | 1 | 8 | 45 | 0.10319 | 1 | 8 | 45 | 0.12873 |
| 55 | 4 | 5 | 46 | 0.08352 | 4 | 5 | 46 | 0.10304 | 4 | 5 | 46 | 0.12866 |
| 56 | 1 | 10 | 45 | 0.08331 | 1 | 10 | 45 | 0.10286 | 1 | 10 | 45 | 0.12853 |
| 57 | 1 | 10 | 46 | 0.08305 | 1 | 10 | 46 | 0.10272 | 1 | 10 | 46 | 0.12847 |
| 58 | 3 | 8 | 47 | 0.08301 | 3 | 8 | 47 | 0.10271 | 3 | 8 | 47 | 0.12846 |
| 59 | 1 | 9 | 49 | 0.08285 | 1 | 9 | 49 | 0.10263 | 2 | 9 | 48 | 0.12843 |
| 60 | 1 | 9 | 50 | 0.08255 | 1 | 9 | 50 | 0.10243 | 1 | 9 | 50 | 0.12832 |
| 61 | 1 | 13 | 47 | 0.08260 | 1 | 13 | 47 | 0.10247 | 1 | 13 | 47 | 0.12835 |
| 62 | 1 | 11 | 50 | 0.08231 | 1 | 11 | 50 | 0.10227 | 1 | 11 | 50 | 0.12823 |
| 63 | 1 | 11 | 51 | 0.08234 | 1 | 11 | 51 | 0.10235 | 1 | 26 | 36 | 0.12830 |
| 64 | 3 | 7 | 54 | 0.08214 | 3 | 7 | 54 | 0.10223 | 3 | 7 | 54 | 0.12824 |
| 65 | 1 | 14 | 50 | 0.08218 | 1 | 14 | 50 | 0.10222 | 1 | 14 | 50 | 0.12821 |
| 66 | 1 | 10 | 55 | 0.08184 | 1 | 10 | 55 | 0.10203 | 1 | 10 | 55 | 0.12813 |
| 67 | 1 | 10 | 56 | 0.08175 | 5 | 6 | 56 | 0.10204 | 1 | 10 | 56 | 0.12811 |
| 68 | 1 | 12 | 55 | 0.08165 | 1 | 12 | 55 | 0.10193 | 1 | 12 | 55 | 0.12808 |
| 69 | 4 | 7 | 58 | 0.08162 | 2 | 11 | 56 | 0.10191 | 2 | 11 | 56 | 0.12808 |
| 70 | 2 | 13 | 55 | 0.08159 | 2 | 13 | 55 | 0.10190 | 2 | 13 | 55 | 0.12807 |
| 71 | 2 | 11 | 58 | 0.08147 | 2 | 11 | 58 | 0.10185 | 2 | 31 | 38 | 0.12812 |
| 72 | 5 | 6 | 61 | 0.08135 | 5 | 6 | 61 | 0.10177 | 5 | 6 | 61 | 0.12801 |
| 73 | 1 | 11 | 61 | 0.08119 | 1 | 11 | 61 | 0.10168 | 1 | 11 | 61 | 0.12797 |
| 74 | 3 | 8 | 63 | 0.08119 | 3 | 8 | 63 | 0.10170 | 3 | 8 | 63 | 0.12799 |
| 75 | 2 | 9 | 64 | 0.08114 | 2 | 9 | 64 | 0.10167 | 2 | 9 | 64 | 0.12797 |
| 76 | 1 | 10 | 65 | 0.08106 | 1 | 10 | 65 | 0.10163 | 1 | 10 | 65 | 0.12796 |
| 77 | 1 | 10 | 66 | 0.08103 | 5 | 7 | 65 | 0.10163 | 1 | 10 | 66 | 0.12795 |
| 78 | 5 | 6 | 67 | 0.08096 | 5 | 6 | 67 | 0.10158 | 5 | 6 | 67 | 0.12794 |
| 79 | 5 | 7 | 67 | 0.08089 | 1 | 12 | 66 | 0.10153 | 1 | 12 | 66 | 0.12791 |
| 80 | 1 | 12 | 67 | 0.08080 | 1 | 12 | 67 | 0.10150 | 1 | 12 | 67 | 0.12790 |
| 81 | 3 | 10 | 68 | 0.08079 | 3 | 10 | 68 | 0.10149 | 3 | 10 | 68 | 0.12790 |
| 82 | 2 | 11 | 69 | 0.08075 | 2 | 11 | 69 | 0.10148 | 2 | 11 | 69 | 0.12789 |
| 83 | 2 | 13 | 68 | 0.08072 | 2 | 13 | 68 | 0.10146 | 2 | 13 | 68 | 0.12789 |
| 84 | 1 | 11 | 72 | 0.08062 | 1 | 11 | 72 | 0.10141 | 1 | 11 | 72 | 0.12786 |
| 85 | 1 | 13 | 71 | 0.08065 | 1 | 13 | 71 | 0.10143 | 1 | 13 | 71 | 0.12787 |
| 86 | 1 | 13 | 72 | 0.08054 | 1 | 13 | 72 | 0.10137 | 1 | 13 | 72 | 0.12785 |
| 87 | 1 | 13 | 73 | 0.08057 | 1 | 13 | 73 | 0.10140 | 3 | 11 | 73 | 0.12787 |
| 88 | 5 | 7 | 76 | 0.08051 | 1 | 24 | 63 | 0.10139 | 5 | 7 | 76 | 0.12785 |
| 89 | 5 | 7 | 77 | 0.08054 | 5 | 7 | 77 | 0.10139 | 1 | 26 | 62 | 0.12785 |
| 90 | 3 | 11 | 76 | 0.08044 | 3 | 11 | 76 | 0.10133 | 3 | 11 | 76 | 0.12783 |
| 91 | 1 | 12 | 78 | 0.08038 | 1 | 12 | 78 | 0.10130 | 1 | 12 | 78 | 0.12782 |
| 92 | 1 | 12 | 79 | 0.08035 | 1 | 12 | 79 | 0.10129 | 1 | 12 | 79 | 0.12782 |
| 93 | 1 | 14 | 78 | 0.08033 | 1 | 14 | 78 | 0.10128 | 1 | 14 | 78 | 0.12781 |
| 94 | 2 | 13 | 79 | 0.08032 | 2 | 13 | 79 | 0.10127 | 2 | 13 | 79 | 0.12781 |
| 95 | 1 | 11 | 83 | 0.08030 | 2 | 15 | 78 | 0.10127 | 2 | 15 | 78 | 0.12781 |
| 96 | 2 | 13 | 81 | 0.08027 | 2 | 13 | 81 | 0.10126 | 2 | 13 | 81 | 0.12781 |
| 97 | 6 | 7 | 84 | 0.08027 | 6 | 7 | 84 | 0.10126 | 6 | 7 | 84 | 0.12781 |
| 98 | 1 | 13 | 84 | 0.08023 | 6 | 7 | 85 | 0.10123 | 6 | 7 | 85 | 0.12780 |
| 99 | 1 | 13 | 85 | 0.08017 | 5 | 8 | 86 | 0.10122 | 1 | 13 | 85 | 0.12779 |
| 100 | 4 | 9 | 87 | 0.08018 | 4 | 9 | 87 | 0.10122 | 4 | 9 | 87 | 0.12779 |

Figure 12

OPTICAL-COUPLER BASED MODULATION-AVERAGING STRUCTURES FOR SELF-SEEDED COLORLESS WDM-PON

FIELD OF THE INVENTION

The present invention relates to colorless passive-optical networks based on dense wavelength division multiplexing, and more particularly to optical networks employing self-seeding of a gain element in an optical network terminal, wherein the network remote node includes modulation averaging structures for link margin improvement.

BACKGROUND OF THE INVENTION

Access networks are presently experiencing rapid growth around the world. Both residential and business customers are demanding increasingly higher bandwidths from their Internet service providers who in turn are pressed to implement networks capable of delivering bandwidths in excess of 100 Mb/s per customer. For this application, passive-optical-networks (PON) are particularly well suited as they feature lowest capital-equipment expenditures relative to point-to-point and active optical networks. The book by C. F. Lam, *Passive Optical Networks: Principles and Practice*, Academic Press, 2007, and publication by C-H. Lee, W. V. Sorin, and B. Y. Kim, "Fiber to the Home Using a PON Infrastructure", *IEEE J. Lightw. Technol.*, vol. 24, no. 12, pp. 4568-4583, 2006 give good introduction into this technology. Wavelength-division multiplexing in passive optical networks (WDM-PON) is one of the actively investigated as next-generation optical network architecture. WDM-PON provides higher bandwidth per user than any other network architecture and hence potentially offers the lowest cost per unit of bandwidth to the user. However, the key difficulty in such a system has been the cost of the components, particularly arising from the need to transmit light at one wavelength for a specific channel and also receive information at any one of several other wavelengths at the user end in the so-called optical network unit (ONU). WDM optical and optoelectronic components traditionally exhibit high cost, among other issues, due to precise wavelength definitions in such systems. A dramatic cost reduction is achieved by eliminating wavelength-specific transceivers at the ONU in the colorless WDM-PON system, also referred to as a system with wavelength-agnostic transceivers in the ONU.

In a colorless optical network, the wavelengths emitted and received by the transceiver in the ONU are defined in the remote node or the central office rather than in the transceiver at the ONU as is well known in the art—see book by Lam cited above. Further reduction in complexity and cost is realized by using self-seeding or self-injection locking technique, in some cases combining a simple mirror or a Faraday mirror with self-seeded structures. FIG. 1 illustrates an example of prior art in this field. A self-seeded WDM-PON network system 100 comprises of central office 101 (CO), remote node 106 (RN), and a multiplicity of optical network units (ONU) of which only one 104 is shown connected to the remote node 106 using distribution fibers of which only one is shown 103. The central office 101 is connected to the remote node 106 with trunk fiber 111, while the remote node 106 is connected to each of the ONUs using a distribution fiber 103. The distribution fiber 103 has length $L_D$ that typically ranges from 500 m to 2 km. The trunk fiber 111 has length $L_T$ that may be 10 km or more, depending on the application. Other ONUs, not shown in FIG. 1, connect to the RN 106 using distribution fibers of various lengths to the available ports 108 on the RN 106. The CO 101 sends independent information or a broadcast to each of the ONUs 104 over the trunk fiber 111 by encoding each data stream into an optical signal of a specific wavelength $\lambda_{Dk}$, where subscript D refers to downstream data traffic, i.e. traveling from the CO 101 to the ONUs 104, and the subscript k indicates the k-th wavelength of a set of wavelengths. Such an optical signal is referred to as wavelength division multiplexed (WDM). The number of optical signals and associated wavelengths of these signals are predetermined by the system hardware and optical standard (eg. ITU). The downstream wavelengths $\lambda_{Dk}$ are equidistantly separated and form the downstream WDM band denoted with $\Sigma\lambda_D$. On the ONU side, each ONU 104 sends a data stream towards the CO 101 at a specific wavelength associated to that ONU 104. The so-called upstream wavelengths $\lambda_{Uk}$ are different from the downstream wavelengths and form the upstream WDM band $\Sigma\lambda_U$.

The ONU 104 is a transceiver for digital data. The transmitted data is upstream data, and received data is downstream data. The transmitting chain of the ONU 104 comprises a gain and modulation chip 105 (GMC), which may be a reflective semiconductor optical amplifier (RSOA) or a Fabry-Pérot laser with a low-reflectivity coating on its front facet from which the light is coupled into a segment of a distribution fiber 103 via a diplexer 110 and optionally a Faraday rotator 109. The diplexer 110 separates the upstream optical signal, denoted with wavelength $\lambda_{Uk}$, from the downstream optical signal denoted with wavelength $\lambda_{Dk}$. The other end of the GMC 105 is terminated with a high-reflectivity mirror 107. A certain amount of optical power is transmitted through said high-reflectivity mirror and captured by a monitor photo diode (not shown in FIG. 1) whose function is to enable monitoring of the optical power emitted from the GMC 105. The ONU 104 is used to convert upstream digital data entering the ONU 104 via electrical terminals 121 to optical signal emitted along the distribution fiber 103. The electrical data entering through the digital interface 121 is processed by the physical-layer chip 120, and is used to intensity modulate the GMC 105 via electrical interconnect 122 thereby encoding the data into the upstream optical signal $\lambda_{Uk}$. The downstream optical signal arriving along the distribution fiber 103 is redirected to a receiver 124 (comprising a photodetector and a transimpedance amplifier) by the diplexer 110. The digital data is received by the optical receiver 124 and is electrically connected using lines 123 to be processed by physical layer chip 120 and delivered to the network processor (not shown) via the electrical terminals 121. The diplexer separates the upstream from the downstream wavelengths as is known in the art.

The remote node 106 comprises an array-waveguide grating 116 (AWG) which serves as a wavelength-division multiplexer/demultiplexer (WDM MUX/DEMUX) for both the downstream and upstream signals. A downstream WDM optical signal arriving at the common port 112 of the AWG 116 is demultiplexed into a number of distinct wavelengths and redirected to the distribution ports 108. The downstream optical signal frequencies are equally distributed within the downstream optical band. The upstream optical signals generated by the multiplicity of ONUs 104 arriving each at a different distribution port (distribution ports 108) and each having a different wavelength $\lambda_{Uk}$ is multiplexed into a single output at the common port 112 of the AWG 116. The optical signal containing multiple wavelengths equally distributed within the upstream band $\Sigma\lambda_{Uk}$ is emitted from the common port 112. The AWG 116 is typically a cyclical array waveguide grating which provides at least two bands with multiple equally-spaced wavelengths in each band as is illustrated in FIG. 2.

FIG. 2 illustrates qualitatively the upstream emission spectrum 252 and the downstream spectrum 253 as it is defined by the cyclic arrayed-waveguide grating (AWG) 116 (shown in FIG. 1). PSD stands for power spectral density. The upstream band $\Sigma\lambda_U$ 262 comprises a multiplicity of equally spaced wavelengths $\lambda_{Uk}$ 266, where k=1, 2, . . . , N, while the downstream band $\Sigma\lambda_D$ 263 comprises a multiplicity of equally spaced wavelengths $\lambda_{Dk}$ 265, where k=1, 2, . . . , N. Not all wavelengths are used at any given time in a network, but the wavelengths and the band are nevertheless allocated for optical signals. The upstream and downstream bands are separated in frequency: The upstream band may use wavelengths in the ITU C-band, while the downstream signal may use wavelengths in the ITU L-band. The AWG may be adjusted so that the upstream and downstream band separation equals the AWG cycle 261 as is shown in FIG. 2.

Common port 112 of the AWG 116 is connected to the trunk fiber 111 via an optical coupler 118 (at least three ports). One port of the optical coupler 118 takes apportion of the upstream optical signal, passes it through a 45-degree Faraday Rotator 113 to be reflected on a fiber mirror 114 as shown in FIG. 1. The sequence Faraday Rotator 113 and the fiber mirror 114 is commonly referred to as a Faraday Rotating Mirror (FRM) and comprises a self-seeding component that returns a portion of the optical signal emitted from port 112 back into the same port 112. Under normal operation, a portion of the optical power of the upstream optical signal $\Sigma\lambda_U$ emitted from the common port 112 is reflected back using the FRM 113/114 to the ONUs 104 for seeding the GMC 105, while a portion of the optical signal with information encoded in its modulation is transmitted through the optical coupler 118 and delivered to the central office 101 via the trunk fiber 111.

The principle of operation of the network system 100 is as follows: The GMC 105 emits spontaneous emission in a broad wavelength band which includes the upstream wavelengths covered by the AWG upstream band 262. As only one port (distribution ports 108) is connected to any one GMC, this broad upstream band is spectrally sliced by the AWG 116 and only a narrow wavelength range around a specific wavelength $\lambda_{Uk}$ is passed through to the optical coupler 118, reflected by the FRM 113/114, and then sent back into the same GMC 105. The seeding signal is now amplified and directly modulated by the GMC 105: Data is encoded into the modulation of the gain and hence a modulated signal is now emitted towards the remote node 106 via the distribution fiber 103. This signal is again spectrum-sliced by the AWG 116 and partially transmitted by the optical coupler 118 to carry the information to the central office 101. A portion of the optical power is returned to the GMC 105 for further seeding. The optical feedback realized by the self-seeding using FRM 113/114 enables stimulated emission and gain clamping within the GMC 105. The emission wavelength is defined by the passband of the AWG: It is the port number (one of the AWG ports 108) that defines the wavelength at which this seeding and laser oscillation happens. In this way, each of the ONUs provides different upstream wavelength. The central office 101 may have analogous optical transmitters operating in the downstream band ($\lambda_{Dk}$) to deliver information to the ONU.

The GMC 105 is typically polarization sensitive: it provides higher gain for only one polarization of the incident seeding light, but may be designed to be polarization insensitive. Polarization insensitive components generally provide less optical gain than the kind that is polarization sensitive. The distribution fiber 103, the AWG, and other optical components the optical signal traverses while making its trip from the GMC 105 and the seeding component 113/114 exhibit a degree of time varying birefringence inherent in the fiber and other waveguide components. For this reason, the optical beam returning to the GMC for seeding will generally experience unknown and fluctuating polarization. This polarization fluctuation and mismatch very often produce an unstable link, a problem that is to a certain degree resolved by using two 45-degree Faraday rotators in the link: one within the remote node 106 FRM 113 and another FR 109 in front of the GMC 105 within the ONU 104. By introducing an FRM in the remote node 106, any retardation in the polarized beam emitted from the GMC 105 on its way to the FRM 113/114 in the remote node 106 is compensated during the beam's travel from the FRM 113/114 back to the GMC 105. Namely, the FRM 113/114 exchanges the electrical field components along the ordinary and the extra-ordinary axes and the returning optical signal undergoes approximately equal change in polarization with the exception that the opposite electric field axes are affected. The resulting beam reaching the GMC 105 is linearly polarized with polarization orthogonal to the polarization of the emitted beam. Inserting another Faraday rotator 109 rotates the polarization of the returning beam to match the original emitted signal polarization. Experimental evidence shows that this improves the stability of the system compared to architectures that employ only a mirror without the rotating element in the seeding element.

An array-waveguide grating (AWG) is a passive optical component that is ubiquitous in optical networking used for filtering, separating, combining, and routing signals of different wavelengths as is well known in the art. Its use and principle of operation are described in publicly available texts, such as, "WDM Technologies: Passive Optical Components" by A. K. Dutta, N. K. Dutta, and M. Fujiwara, published by Academic Press in 2003. The AWG is most commonly implemented using planar lightwave circuit technology. Planar lightwave circuit technology (PLC) is described in many publicly available texts such as "Planar Circuits for Microwaves and Lightwaves" by Takanori Okoshi, published by Springer Verlag 1985 and in "Frontiers in Planar Lightwave Circuit Technology: Design, Simulation, and Fabrication" published by NATO Science Series, 2006. The physical properties of the dielectrics used in building the AWG are temperature dependent and consequently this temperature sensitivity results in a shift of the filter wavelengths. It is well known in the art today that this temperature variation can be efficiently compensated by using so-called athermal array-waveguide gratings.

There has been a number of proposed implementations of the self-seeding, often referred to as self-locking, technique in the industry.

All self-seeding architectures are vulnerable not only to polarization stability issues but to modulation stabilization issues. The seeding optical signal returning to the ONU 104 from the FRM 113/114 is modulated. The modulation is uncorrelated to the data stream that needs to be transmitted from the GMC 105. The presence of this residual modulation in the seeding light deteriorates the optical signal emitted from the ONU because now the emitted signal contains both the new amplitude modulation and the residual modulation. There are several approaches explored to reduce the effect of this residual seeding light modulation: the most common approach is to drive the GMC into saturation where differential gain is lower, there are reports of using electronic compensation of the modulated signal, and finally performing optical modulation averaging of the seeded light within the remote node. The latter approach stabilizes the optical link by removing the modulation in the seeded light stream The network architectures disclosed in prior art deliver very high bandwidth per client, but they have not yet been widely deployed due to a number of yet unresolved issues some of which include low seeding stability, low link margin, and high cost. Therefore, an unmet need for a low-cost high-performance WDM-PON solution exists in the industry. This application discloses optimal coupler-based modulation-averaging reflector structures for low-cost implementation for self-seeded colorless optical networks with improved stability and link margin.

BRIEF DESCRIPTION OF THE FIGURES

FIG. 6A: Exemplary illustration of a modulation-averaging structure with two ports based on single-coupled rings—noncontiguous topology.

FIG. 6B: Exemplary illustration of a modulation-averaging structure with two ports based on single-coupled loops—contiguous topology.

FIG. 12: A table with a listing of select three-loop modulation-averaging reflector designs with optical coupling coefficient fixed at 50% and varying optical coupler absorptance a. The design specifications include three round-trip time to design time ratios (one for each ring) rounded to nearest integer, the sum of loop lengths normalized to said design time, and the computed normalized gamma prime (NGP).

SUMMARY OF THE INVENTION

This application discloses a family of waveguiding structures that average optically modulated signals and can be made to either depolarize or maintain the polarization of the same optical signals if they were linearly polarized when incident on said structures. Furthermore, the application discloses structures and design rules for which these optical modulation averaging structures exhibit their highest modulation averaging potential for lowest overall length and component count.

Figure 3:
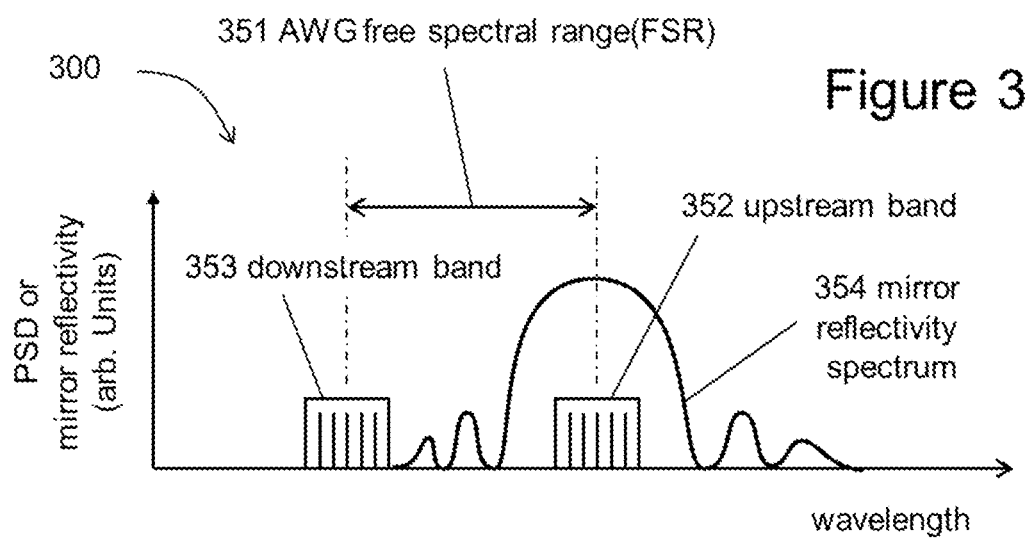
FIG. 3: Upstream and downstream wavelength selection by suitably designed mirror reflectivity spectrum.
Figure 4A:
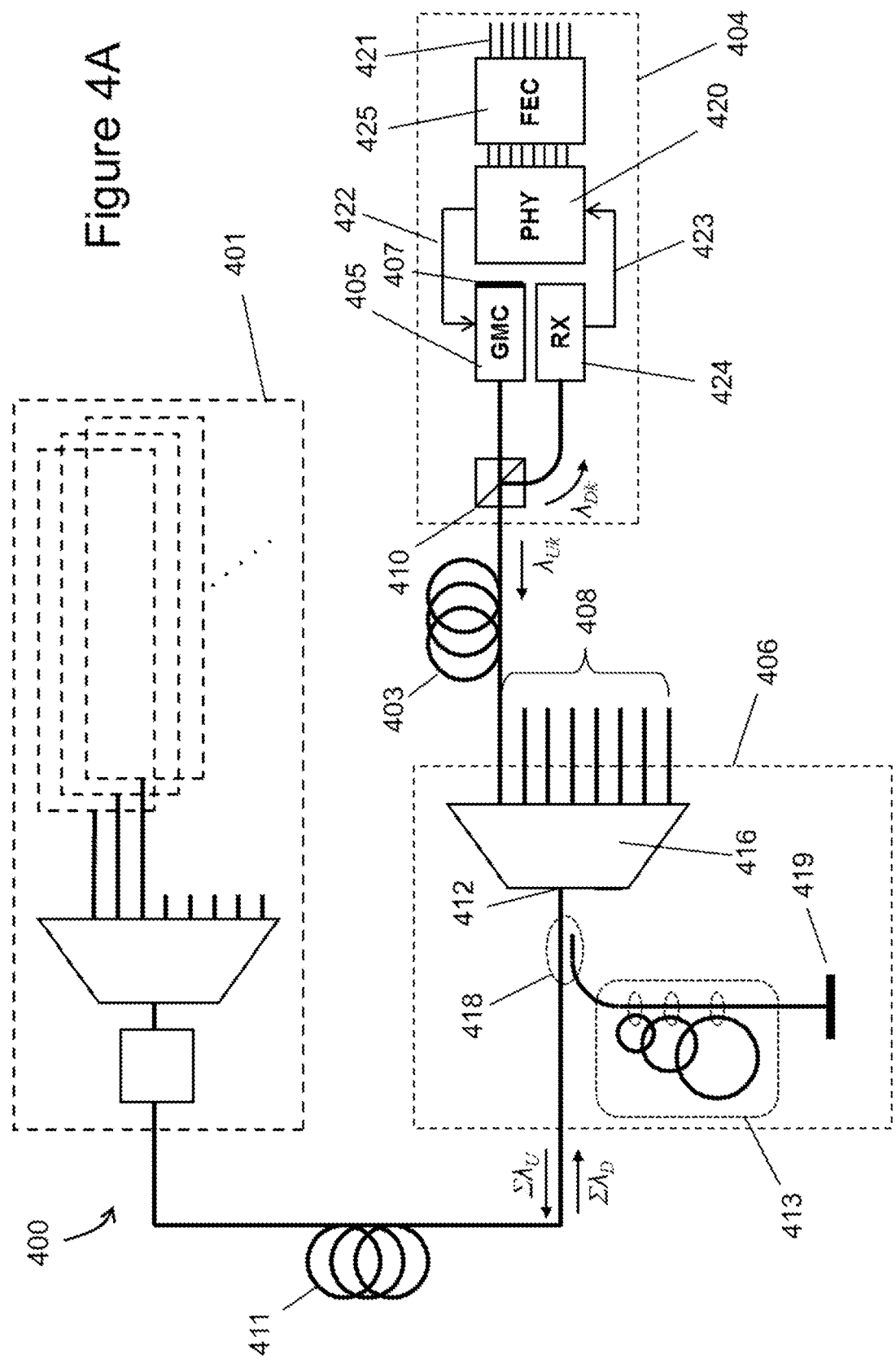
FIG. 4A: Exemplary block diagram of a self-seeded WDM-PON system that utilizes depolarizing modulation-averaging structures.
Figure 4B:
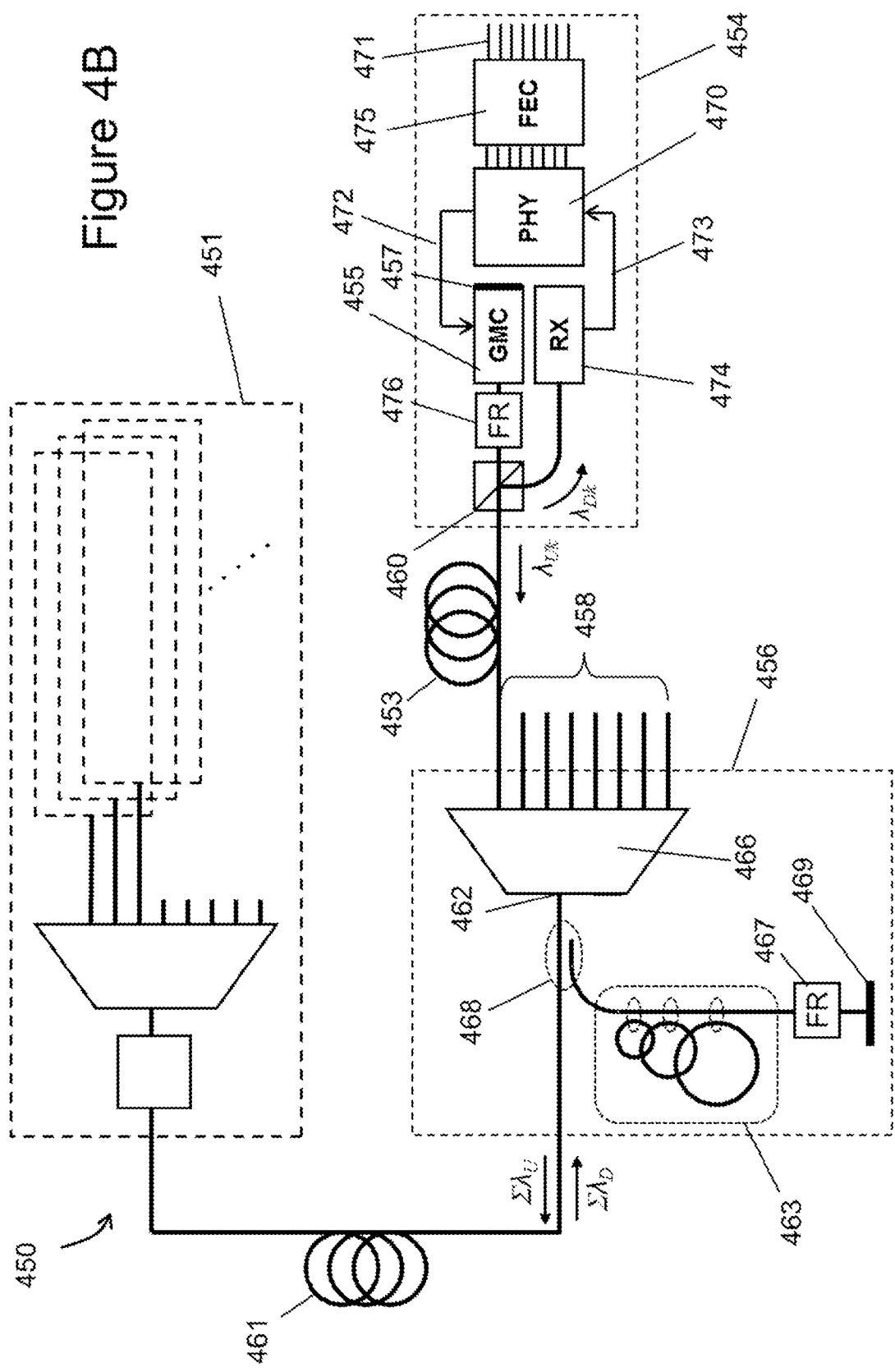
FIG. 4B: Exemplary block diagram of a self-seeded WDM-PON system that utilizes polarization maintaining modulation-averaging structures.
Figure 5:
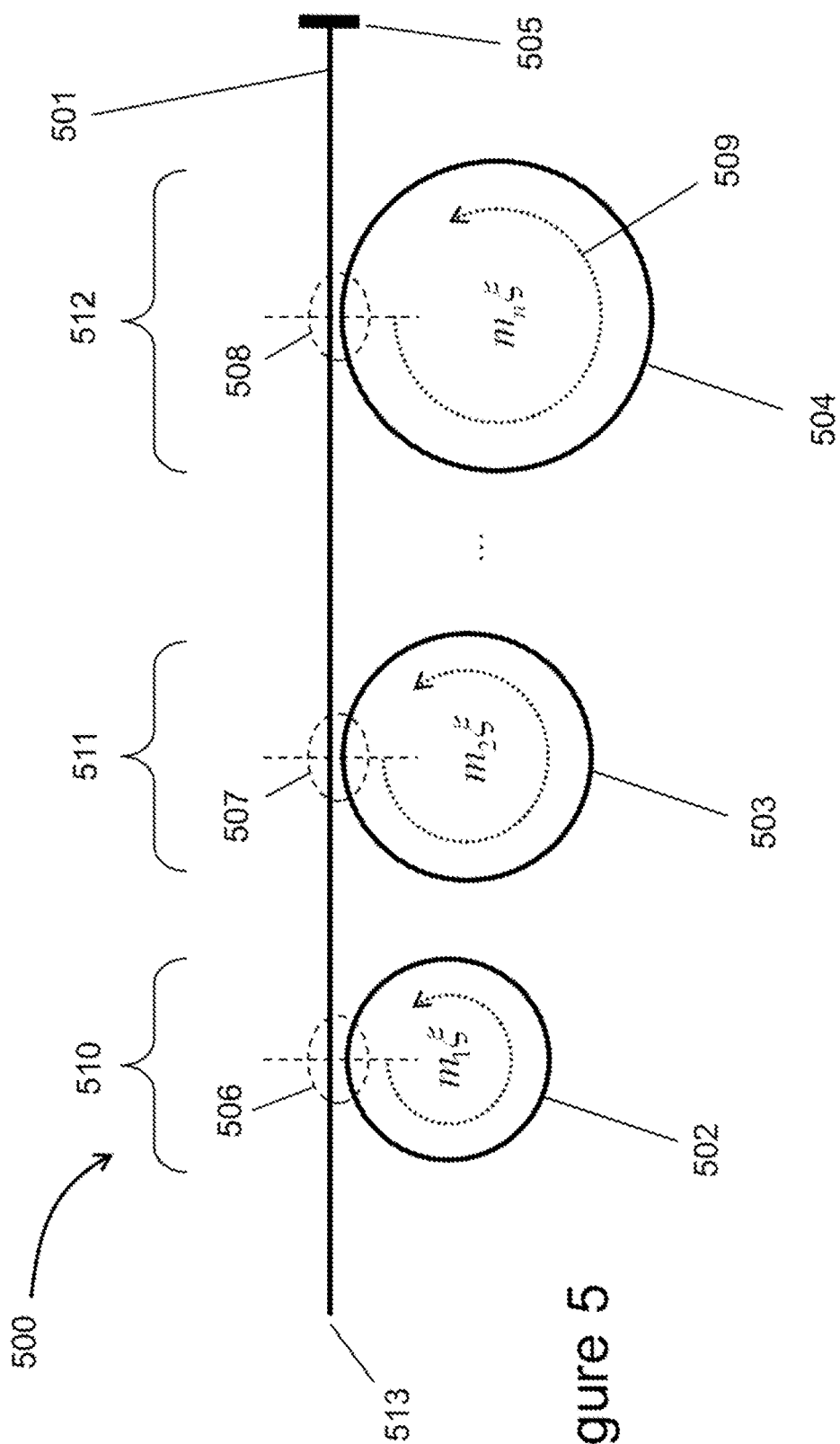
FIG. 5: Exemplary illustration of a single-coupled modulation-averaging reflector formed by cascading rings on a central waveguide and terminating that waveguide with a high-reflectivity waveguide mirror.

Certain features of a novel apparatus for improving the performance and lowering the cost of self-seeded colorless WDM-PON networks are described with the help of FIGS. 3, 4A, 4B, and 5. FIGS. 4A and 4B illustrate block diagram of exemplary self-seeded WDM-PON systems 400 and 450 that feature one or more improvements over the prior art, while FIG. 5 is used to disclose a coupler-based modulation averaging reflector.

Network Architecture with Depolarizing Self-Seeding

Figure 1:
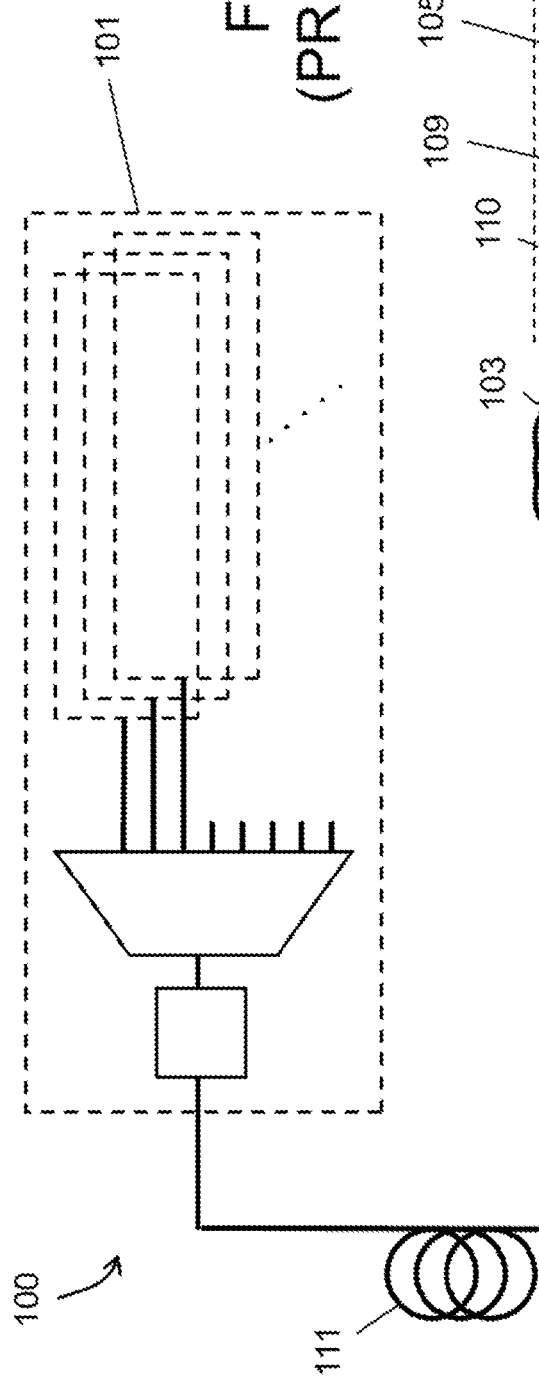
FIG. 1: (PRIOR ART) Self-seeded WDM-PON architecture.
Figure 2:
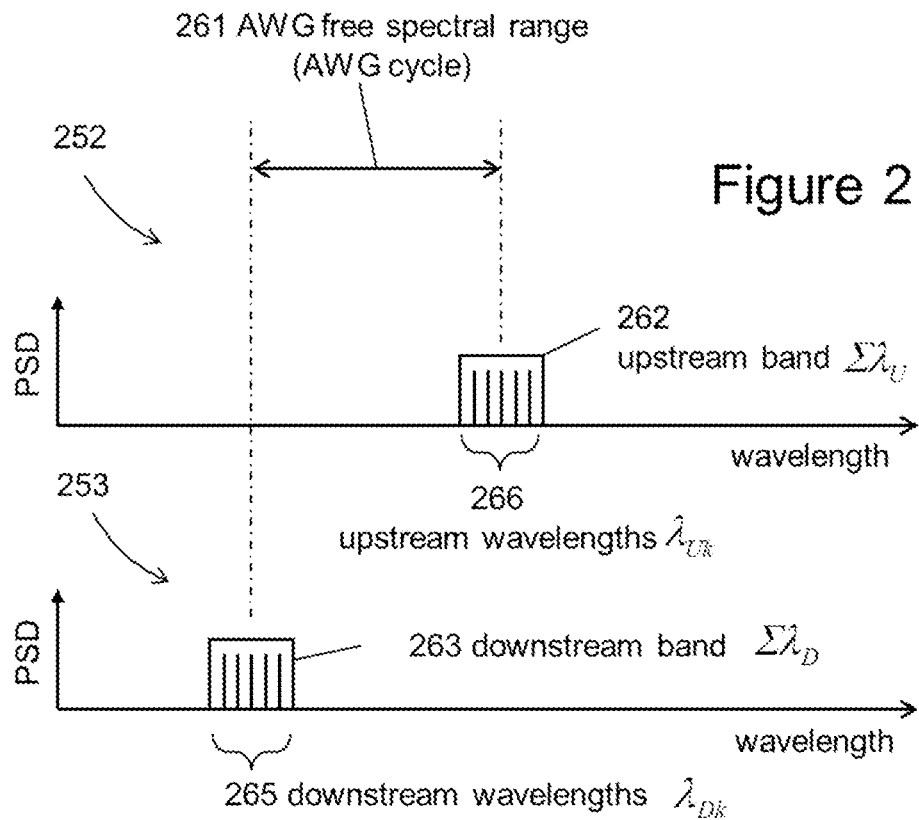
FIG. 2: (PRIOR ART) Illustration of the upstream and downstream bands and the cyclical nature of the AWG.

In one embodiment of the optical network system 400, illustrated in FIG. 4A, an optical network unit (ONU) 404 comprises a gain and modulation chip (GMC) 405 terminated with a near-unity reflective mirror 407 on one end and a segment of a distribution fiber 403 on the other end of the GMC 405 coupled via a diplexer 410 to the distribution fiber 403, an optical receiver 424, a physical-layer (PHY) circuit chip 420, and an optional forward-error correction chip 425. The GMC 405 is intensity modulated using a data stream provided by the PHY chip 420 via electrical interconnection 422. The GMC 405 may be a reflective semiconductor optical amplifier (RSOA) or a Fabry-Pérot laser with low front-facet reflectivity. The optical signals received by the ONU 404 are diverted to a receiver 424 comprising a photodiode and a transimpedance amplifier (not shown) using diplexer 410, and the detected data stream in wired to the PHY chip 420 via interconnection lines 423. The distribution fiber 403 optically couples the ONU 404 with the remote node (RN) 406. The remote node 406 comprises an array-waveguide grating (AWG) 416 with at least one common port 412 and a multiplicity of distribution ports 408, each with its own downstream wavelength $\lambda_{Dk}$ and/or upstream wavelength $\lambda_{Uk}$ (subscript k indicates k-th wavelength of N possible wavelengths). In one embodiment, the AWG is cyclical in the sense that each distribution port allows at least one upstream wavelength and at least one downstream wavelength to pass as is indicated with FIG. 2 and the upstream and downstream wavelengths are different. An example of the optical transmission bands is shown in FIG. 2. The common port 412 of the AWG 416 is connected to an optical coupler 418 that couples a portion of the power emitted from port 412 to an optical modulation averaging structure 413 terminated with a high-reflectivity fiber mirror 419 and an another portion towards the trunk fiber 411 and the central office 401. The modulation averaging structure 413 is disclosed in the remainder of this application. It generally comprises at least two fiber loops, each loop coupled to a central waveguide using one optical coupler per loop. The trunk fiber 411 connects the RN 406 to the CO 401 which may have the same transmit/receive architecture but with the emission band of the CO corresponding to the downstream band $\lambda_D$ and the receiving band of the CO corresponding to the upstream band $\lambda_U$ of the ONU. The remote node 406, the distribution fiber 403, and the gain element 405 (with the mirror 407) and optional diplexer 410 are integral part of an optical source. The term "diplexer" here refers to an optical component that separates two signals of two different wavelengths where the signals traverse component in both directions simultaneously, referring to full duplex communication.

In one embodiment, the modulation-averaging structure 413 and fiber mirror 419 depolarize any optical signals arriving from the optical coupler 418. Namely, the upstream optical signal arriving from GMC 405 is returned to the GMC 405 depolarized at the modulation-averaging structure 413. For this purpose, the modulation-averaging structure 413 may comprise polarization maintaining fibers and optical couplers.

Network Architecture with Polarization Maintaining/Preserving Self-Seeding

In one embodiment of the optical network system 450, illustrated in FIG. 4B, an optical network unit (ONU) 454 comprises a gain and modulation chip (GMC) 455 terminated with a near-unity reflective mirror 457 on one end and a segment of a distribution fiber 453 on the other end of the GMC 455 coupled via a 45-degree Faraday Rotator 476 and a diplexer 460 to the distribution fiber 453, an optical receiver 474, a physical-layer (PHY) circuit chip 470, and an optional forward-error correction chip 475. The GMC 455 is intensity modulated using a data stream provided by the PHY chip 470 via electrical interconnection 472. The GMC 455 may be a reflective semiconductor optical amplifier (RSOA) or a Fabry-Pérot laser with low front-facet reflectivity. The optical signals received by the ONU 454 are diverted to a receiver 474 comprising a photodiode and a transimpedance amplifier (not shown) using diplexer 460, and the detected data stream is wired to the PHY chip 470 via interconnection lines 473. The distribution fiber 453 optically couples the ONU 454 with the remote node (RN) 456. The remote node 456 comprises an array-waveguide grating (AWG) 466 with at least one common port 462 and a multiplicity of distribution ports 458, each with its own downstream wavelength $\lambda_{Dk}$ and/or upstream wavelength $\lambda_{Uk}$ (subscript k indicates k-th wavelength of N possible wavelengths). In one embodiment, the AWG is cyclical in the sense that each distribution port allows at least one upstream wavelength and at least one downstream wavelength to pass as is indicated with FIG. 2 and the upstream and downstream wavelengths are different. The common port 462 of the AWG 466 is connected to an optical coupler 468 that couples a portion of the power emitted from port 462 towards the trunk fiber 461 and the central office 451 and another portion toward an optical modulation averaging structure 463 terminated with a Faraday Rotating Mirror (FRM) comprising of a 45-degree Faraday Rotator 467 and fiber mirror 469. The modulation averaging structure 463 is a polarization maintaining modulation-averaging structure and is disclosed in more detail in the remainder of this application. It generally comprises at least two polarization-maintaining fiber loops, each loop coupled to a polarization maintaining central waveguide using one polarization-maintaining optical coupler per loop. The trunk fiber 461 connects the RN 456 to the CO 451 which may have the same transmit/receive architecture but with the emission band of the CO corresponding to the downstream band $\lambda_D$ and the receiving band of the CO corresponding to the upstream band $\lambda_U$ of the ONU. The remote node 456, the distribution fiber 453, and the gain element 455 (with the mirror 457) and an optional diplexer 460 and Faraday Rotator 476 are integral parts of an optical source.

In one embodiment, the modulation-averaging structure 463, the Faraday Rotator 467, and fiber mirror 469 average but maintain the polarization of any optical signals arriving from the optical coupler 468. Namely, the upstream optical signal arriving from GMC 455 is returned to the GMC 455 with the same polarization as it was launched (provided the FR 476 is present). The modulation-averaging structure 463 comprises polarization maintaining fibers and optical couplers.

Optical Couplers

Optical couplers generally exhibit three or four ports. Unless otherwise specified, in this disclosure, we shall use optical couplers with four ports that are often referred to as four-port couplers or 2×2 couplers. This type of optical coupler is ubiquitous in the optics industry and is described in public literature such as "Electromagnetic Principles of Integrated Optics" by Donald Lee, published by John Wiley, 1986. A four-port optical coupler comprises two waveguides or optical fibers that are brought into proximity of each other over some length of the waveguide referred to as the coupling or mixing section. Within the coupling section, the evanescent fields of the electro-magnetic wave propagating along one of the two waveguides overlaps with the waveguide causing the energy from the first waveguide to transition into the other. This process is referred to coupling of electromagnetic energy and is quantified by a power coupling coefficient κ. The coupling coefficient may also depend on wavelength of light propagating through the coupler.

In this application we use a coupler-port numbering and coupling coefficient naming convention defined as follows: When an optical signal with power $-P_1$ is incident from port 1, the coupling coefficient κ quantifies the fraction of power $-P_1$ that is coupled to and exits from port 4: $\kappa=-P_4/P_1$. Power $P_2$ exiting from port 2 is also proportional to the incident power $-P_1$, but with proportionality constant demoted with $t=-P_2/P_1$. The sign convention is taken positive if the power is leaving the coupler and negative if the power is entering any one of the ports. In a well-designed optical coupler, negligible power reaches port 3 ($P_3 \ll -P_1$, $P_2$, $P_4$). The power $P_3$ reaching port 3 divided by the power incident on port 1 ($-P_1$) is referred to as coupler directivity. The port numbering is defined so that when optical wave is incident at any port of first parity (odd or even) the power returning to the other port of the same parity is generally negligible in high directivity optical couplers. As illustrated in the above example, this numbering convention has the useful feature that, even-numbered ports couple energy to odd-numbered ports and vice versa: In a high-directivity optical coupler, coupling between ports of same parity is negligible. For a lossless optical coupler we have $P_1+P_2+P_3+P_4$ 0.

Clearly, in a high-directivity lossless coupler, we have $\kappa+t=1$, but if losses are present in the coupler, then $t+\kappa<1$. Typical directivities on good quality fiber-optical couplers are below −50 dB. In a very low loss coupler, almost of all of the energy incident to one port is emitted out of the ports with opposite parity. Owing to reciprocity, the same coupling coefficient leads to ratio of transmitted powers into all ports when the energy is incident at other ports, as is well known in the art.

Optical couplers, whether based on optical fibers or planar waveguides, tend to have a statistical variation of the coupling coefficients and loss. The characterization of the final product is most often realized by measuring the insertion loss from port 1 to 4 and to 2, and the other way around realizing four values. A simple model we use in this application to quantify the coupler performance is based on two values of insertion loss measured on an optical coupler: the average insertion losses experienced by an optical signal when coupled from one side to two different branches on the other side of the coupling region: $IL_1$ and $IL_2$ [dB]. The two measured values can be interpreted as coming from an ideal coupling coefficient $\kappa_0$ and absorptance a via $$10^{-IL_1/10}=(1-\kappa_0)(1-a) \quad 10^{-IL_2/10}=\kappa_0(1-a) \quad (1)$$

With this model, one can extract $\kappa_0$ (or $t_0$) and absorptance a to define the performance of an optical coupler. The ideal coupling coefficient $\kappa_0$ (or $t_0$) will generally deviate from the nominal value. Using this type of model, we find that in contemporary low-loss fiber-optic couplers a<0.10, while the extracted coupling coefficients deviate from the nominal by less than 1%.

High-Reflectivity Mirrors

Some embodiments disclosed in this application rely on high reflectivity optical mirrors that exhibit high reflectivity at one wavelength range and are transmitting in another wavelength range. It is well known in the art that high-reflectivity mirrors are realized as quarter-wave stacks of thin films and that reflectivities in excess of 90% or approaching 99.9% can be achieved in this manner for most wavelengths of interest in optical communications. Such mirrors are realized as interference filters and they exhibit high reflectivity for one range of wavelengths and low reflectivity in another. Bragg grating is a form of an interference mirror that may be manufactured by holographic exposure or by lithography. The optical interference coatings may be deposited at the end of fibers or onto the edges of planar lightwave circuits, as is well known in the art. There is a variety of designs that realize high reflectivity in one and high transitivity in another wavelength band. The design and practical realization of such coatings is described in publicly available texts, for example, "Wavelength Filters in Fibre Optics" edited by H. Venghaus and published by Springer Verlag in 2006.

Some of the interference filters serving as mirrors in various embodiments disclosed in this application exhibit high reflectivity for upstream wavelength band and low reflectivity (and high transitivity) for the downstream band. This wavelength selection is illustrated in FIG. 3 where the power-spectral density 300 of the typical WDM-PON communication spectrum is shown with an upstream band 352 and a downstream band 353 containing multiple wavelengths in each band. The AWG cycle 351 is the wavelength separation of the cycles of a cyclical AWG. The cycle is the free spectral range (FSR) of the array waveguide grating. An exemplary high reflectivity mirror spectrum 354 exhibits high reflectivity around the wavelengths corresponding to the upstream band 352, but good transmission (low reflectivity) at the wavelengths corresponding to the downstream band 353. In another embodiment, the high-reflectivity mirror spectrum exhibits high reflectivity over the entire upstream and downstream spectra. A person skilled in the art of optics and interference coatings would know how to design such an interference coating. Such coatings are available commercially.

Coupler-Based Optical Modulation Averaging Reflectors

FIG. 5 shows one embodiment of a coupler-based modulation-averaging reflector 500 comprising a central waveguide 501, a multiplicity of waveguide rings 502, 503, and 504 (only three rings shown), and a high-reflectivity mirror 505. The high-reflectivity mirror terminates one end of the central waveguide 501, while the other end is referred to as the input port (513). Each of said waveguide rings (502, 503, and 504) is optically coupled to central waveguide 501 exactly once using one four-port optical coupler (506, 507, and 508) for each waveguide ring (502, 503, and 504). We refer to this type of structure as a single-coupled-ring modulation-averaging reflector (it is also possible to couple each of the waveguide rings multiple ways amongst themselves and to the central waveguide to achieve different properties without departing from the spirit of the invention).

For the purpose of analysis and ease of description, the structure shown in FIG. 5 is described as a cascade of two-port segments 510, 511, and 512, the cascade terminated with a high-reflectivity mirror 505, each two-port segment comprising one two-port coupler, and one waveguide ring. A single-coupled-ring optical modulation averaging reflector with n rings hence has n two-port segments. Each two-port segment i of the structure shown in FIG. 5 has the following attributes: optical coupler coupling coefficient $\kappa_i$, optical coupler transmission coefficient $t_i$, waveguide-ring round-trip time $\tau_i$, and waveguide-ring round-trip optical loss $\alpha_i$. Said round-trip time $\tau_i$ will in the following text be most often expressed as a multiple $m_i$ of a predefined design time $\xi$, i.e., $\tau_i=m_i\xi$. Inasmuch as the group velocity $v_g$ of light propagation within any waveguide can be unambiguously determined for any wavelength of propagation, it is also possibly to refer to round-trip distance or perimeter of the loop or ring. In this situation, the "design time" is often specified as "design length".

The optimization of averaging properties of the structure shown in FIG. 5 requires adjustment of the individual attributes of each of the two-port segments in the cascade. The desired property of the modulation-averaging structure is maximum averaging potential expressed in the lowest optical signal variance when square-wave optical signal is incident on the modulation-averaging structure, referred to as "gamma", while component count and fiber length are kept at minimum. Numerical and analytically optimization has been performed showing that best modulation averaging properties of the entire modulation-averaging structure are realized when the relationship between the round-trip times of any two rings should have the greatest common divisor (GCD) equal to unity or that the round trip times of all segments should be very different from each other, i.e., one much larger than the previous. If optimization is carried out in the presence of coupling loss and propagation loss, one finds that optical-coupler losses and fiber losses introduce a floor in the gamma figure of merit. For typical optical coupler loss (several percent) and optical fibers in place of waveguides, the ratio between lowest round trip time and the next one in size is at least twice, preferably three times.

The distance between the optical couplers in FIG. 5 does not influence the averaging performance. Each ring structure acts as a delay element with no reflection and hence the structure shown in FIG. 5 is a unidirectional modulation averaging reflector. For this reason, the order of rings is not important.

Figure 9A:
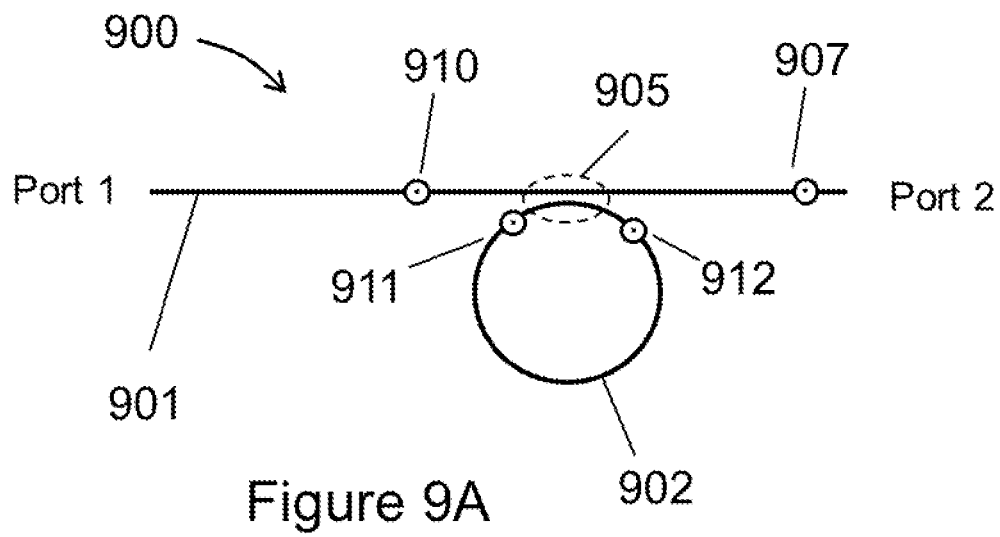
FIG. 9A: One segment of a polarization maintaining single-coupled loop cascade.
Figure 9B:
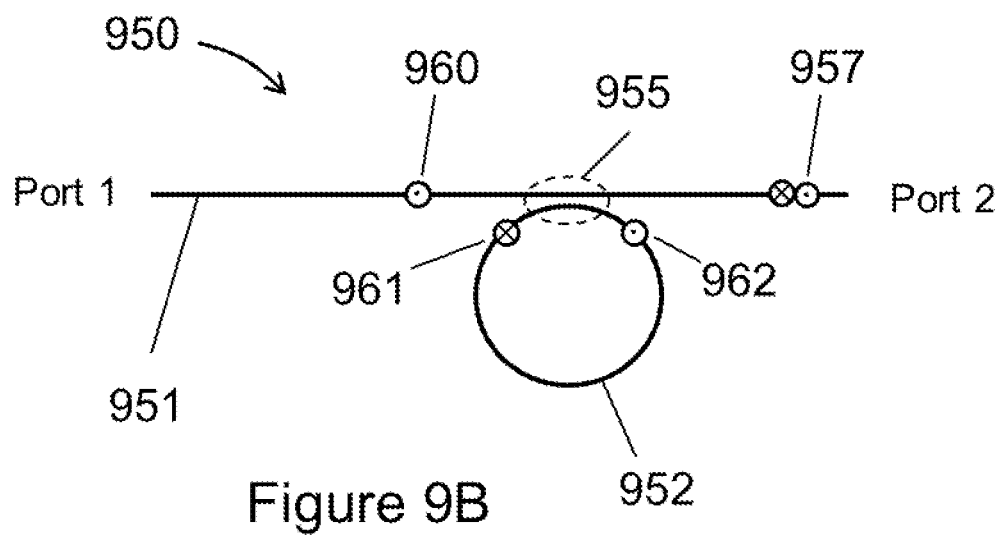
FIG. 9B: One segment of a depolarizing single-coupled loop cascade.

Optical fibers or waveguides and optical couplers used in the structure shown in FIG. 5 may be polarization maintaining if the incident light is to be depolarized. Optical fibers or waveguides and optical couplers used in the structure shown in FIG. 5 may also be polarization maintaining if the incident light is to be polarized and in this case, the mirror 505 is a Faraday Rotating mirror and the relative orientation of polarization maintaining waveguides and optical couplers is illustrated in FIGS. 9A and 9B.

It is important to note that optical-waveguide (or fiber) loops were previously used for various applications in the optics industry, but never with the specific design to perform modulation averaging. For example, U.S. Pat. No. 4,479,701 shows using a single fiber loop as an optical memory, U.S. Pat. No. 4,696,063 shows using a single loop to band-limit optical signal flow between subscribers, and U.S. Pat. No. 6,700,113 where a combination of fiber loops and acousto-optic tunable filters is used to reduce intensity modulation in an optical system.

DETAILED DESCRIPTION OF THE INVENTION

A modulation averaging structure is generally a two-port optical component that averages the intensity modulation of an optical signal digitally encoded at a known symbol rate B in an incoherent optical communication system. Intensity modulation refers to, for example, on/off keying or pulse-amplitude modulation characterized by (i) the symbol state duration $\tau$, (ii) the number of intensity levels into which information is encoded, (iii) the frequency content and the maximum runlength of the modulated optical signal. The number of symbol changes per second in a signal is referred to as symbol rate B. Symbol rate is also referred to as baud or modulation rate in digitally modulated signals and is measured in baud (Bd) or symbols/second. The symbol rate is related to, but should not be confused with, the bitrate which is the number of bits of useful information transmitted per second because each symbol can represent several bits of data if multiple-level amplitude modulation is used or DC balancing and error-correcting codes are used. In a simple binary keyed digital signal commonly used in, for example, optical variants of Gigabit Ethernet (1000BASE-XX), the symbol rate (also referred to as line rate) is greater than the bit rate by 25%, the number of intensity levels is two (PAM-2), while the frequency content is that of a 8B10B coding algorithm (maximum runlength equals five). In PAM-4 modulation scheme, the number of intensity levels is four, while the symbol state duration is one bit. The upcoming analysis of modulation-averaging reflectors will be based on PAM-2 modulation, but it is clear that the modulation averaging reflector is useful in but not limited to averaging the modulation in any of the mentioned intensity modulation schemes.

Modulation averaging is accomplished by constructing waveguide structures in which delayed versions of the incident optical signal (symbol stream) are repeatedly added with lower amplitude. A PAM-2 modulated optical signal with a random bit sequence features a two-peak intensity probability distribution wherein the two peaks (centers thereof) are separated by the peak-to-peak intensity modulation value also referred to as the optical modulation amplitude (OMA). The perpetual addition of the delayed sections of a random signal averages the symbol stream resulting in an optical signal whose intensity distribution is normal (Gaussian) rather having two peaks. The repeated adding of delayed replicas of the incident optical signal is possible within the modulation averaging structure by splitting the optical power of the incident signal and redirecting it into waveguide sections that exhibit different delays and then combining the optical signals in the delayed sections. In one embodiment, the splitting and combining of the optical signals is performed using optical couplers. Two key design issues enabling efficient modulation-averaging using delayed replicas of the incident signal are (a) ensuring that the optical powers of delayed signal replicas add without interference when combined, and (b) ensuring that the delay differences between successive delay branches are equal or greater than the symbol duration time.

The key design parameter for any modulation averaging structure is the "design time" denoted with $\xi$ and its spatial equivalent "design length" $L_\xi = v_g \cdot \xi$, where $v_g$ is the group velocity in the waveguide. The reciprocal of the design time is the "design rate" $B_\xi = 1/\xi$ of a modulation averaging structure. A modulation averaging structure provides multiple reflections of the incident signal wherein the reflections occur at a time delay equal to a predefined multiple of the design time. If the symbol duration $\tau$ equals the design time $\xi$, sequences of symbols will be synchronously added to each other which will result in averaging of the modulating signal. Under this condition, portions of the incident modulated optical signal are repeatedly delayed by an integer number of symbol durations and finally summed before exiting the modulation-averaging structure.

The above-mentioned perpetual summation relies on the assumption that there is no interference between the two added signals. This is possible when the first-order (field-based) correlation of the two light beams is negligible. Another way of stating the same condition is that the coherence time of the optical signal is shorter ($\tau_{coh} < \tau$) or preferably much shorter ($\tau_{coh} \ll \tau$) than the smallest delay difference in the modulation averaging structure. Generally, the shortest time difference in a modulation-averaging structure is equal to the design time $\xi$, where one achieves $\tau_{coh} \ll \xi$. Not meeting this condition strictly will not prevent the modulation averaging structures from performing their function, but the averaging potential can be significantly reduced. The analysis and design of modulation averaging reflectors is all done assuming that the addition of delay signals is added incoherently: intensities added.

We define coherence time as the time interval for which the autocorrelation function $R(\tau)$ of the electric field reduces to ½ of its peak value. The coherence referred to here is the degree of first-order optical coherence. Another definition of coherence time resulting in similar coherence time values involves the integral of the magnitude of the normalized autocorrelation function. Inasmuch as the condition for efficient modulation averaging requires that the delays be larger or much larger than the coherence time, both definitions will result in the same requirement. For optical signals with amplified spontaneous emission noise, the auto-correlation function is at maximum at $\tau=0$ and decreases with $|\tau|$. Coherence length is defined as the product of coherence time and group-velocity of optical signal: $L_{coh} = v_g \tau_{coh}$. The transmission through the passband of an AWG takes a shape that is determined by the AWG design. The power-spectral density, or commonly referred to as optical spectrum of the transmitted signal has a coherence time, coherence length, and linewidth that are determined by the shape of the WDM filter, the AWG. The coherence time of a light beam filtered by a Gaussian-shaped AWG with FWHM $(\Delta \lambda)=0.05$ nm at wavelength $\lambda=1550$ nm is given by (where c is speed of light in vacuum):

$$\tau_{coh} = \frac{2\ln 2}{\pi}\left(\frac{\lambda^2}{c\Delta\lambda}\right) \approx 70 \text{ ps} \tag{2}$$

Group velocity $v_g$ of an optical signal is given by the velocity of light in vacuum divided by the group-refractive index of the medium or waveguide in which the optical signal travels, as it is well known in the art. A modulation averaging structure (reflector) that exhibits delay difference between different delay lines, for example, larger than 70 ps for the above case, would exhibit efficient modulation averaging.

The degree to which the reduction in modulation is possible depends on the architecture of the modulation-averaging structure. Modulation-averaging structure is generally a two port optical component (it has an input and output), but may have more than two ports. Terminating one of the ports of a two-port modulation averaging structure with a high-reflectivity mirror creates a modulation averaging reflector, which is a single-port optical component. Modulation-averaging reflector has an optical intensity reflection response y(t) resulting from an optical input signal x(t) given with the convolution:

$$y(t) = \int_0^\infty h(t-t')x(t')dt' \quad (3)$$

In one embodiment, all of the delays realized within a modulation-averaging reflector are integer multiples of the design time $\xi$. For the case shown in FIG. 5, this corresponds to all the m's being integers greater than zero: $m_1$, $m_2, \ldots, m_n \in N$, where N is the set of natural numbers. In this case, h(t) is a sequence of δ-functions of varying amplitude positioned along the time axis at equidistant intervals. This enables discretizing the time scale for the purpose of a simplified treatment needed for understanding the design. When time is discretized the impulse response can be written as h(k), where k is the ordinal number of the sample (an integer greater or equal to zero). Ideal modulation averaging structures are lossless: all of the energy entering the structure will eventually exit though the available ports. If loss is present, some of the energy will be lost within the modulation-averaging structure. This is expressed with $$\sum_{k=0}^\infty h(k) \le 1, \quad (4)$$

where the equality sign holds for the lossless (ideal) case. Real structures use mirrors, optical couplers, and waveguides all of which exhibit some degree of loss.

Topology Terms

In the upcoming disclosure, we will use words "loop", "ring", and "path". With the word "path" or "path along a waveguide structure or network" we mean a topological path that follows the path of electromagnetic energy flow. In other words, a path follows a waveguide and may cross over to another waveguide at an optical coupler. A path may not be reflected back on along the same waveguide unless a waveguide mirror is encountered. (A poor directivity coupler does not alter the direction of a path). Generally, a path also has a direction which coincides with the direction electromagnetic energy flow along a path.

By the word "waveguide loop" or "closed waveguide loop" we mean a topological path along a waveguide structure or network whose initial point is equal to its terminal point. By the word waveguide "ring", we will refer to a waveguide loop in which the path always remains in the same waveguide, even if the path encounters an optical coupler. For example, the path in a ring does not cross over into another waveguide at an optical coupler, whereas the path in a loop may cross over to the other waveguide. For avoidance of confusion, a "waveguide ring" may have any physical shape as long as it has the topology of a ring. Additionally, it is clear that any waveguide ring is also a waveguide loop, namely, ring topology is a subset of loop topology.

Another topological term used in this application is "connected waveguide structure". A connected graph is a topological term used to describe a graph for which there is a path from any point to any other point in the graph. Similarly, for the purposes of this application a "connected waveguide structure" means that that there is a path from any point in any waveguide of the structure to any other point in any waveguide making up the structure such that the path never leaves the structure.

Figures of Merit

The attributes of modulation averaging reflectors (or modulation-averaging structures in general) are (a) modulation-averaging design rate $B_\xi=1/\xi$, where $\xi$ is the design time (symbol duration), (b) the number of optical couplers used, (c) length of individual rings or loops, and their sum (total waveguide length), and (d) the coupling and transmission coefficients of the optical couplers, and (e) waveguide loss.

The key figures of merit needed to quantify the quality of a modulation-averaging structure or reflector are (a) insertion loss ($\Gamma$ linear or IL in dB) which specifies how much power is returned from the modulation-averaging structure divided by the power incident owing to loss by absorption or scattering within the modulation averaging structure, and (b) square-root of the amplitude variance of the signal exiting the modulation-averaging reflector (or structure) when a random symbol sequence with unity amplitude is incident to the structure, referred to as $\gamma'$ ("gamma prime"). The latter, gamma prime, is more often reported normalized to the power returning from the modulation averaging reflector as Normalized Gamma Prime (NGP) defined as the ratio of NGP=$\gamma'/\Gamma$.

The basic structure of a single-coupled ring (or loop) modulation averaging structure with any number of rings (loops) has intensity impulse response given by a sequence of delta functions generally written as, $$h(t) = \sum_{k=0}^\infty h_k \delta(t-t_k), \quad (5)$$

The coefficients $h_k$ are positive definite because the output is intensity, which cannot be negative. When the round trip times of all rings (or loops) are an integer multiple of the design symbol duration $\xi$, their time instances become a linear function of the ordinal number k: $t_k=k\cdot\xi$ and hence the impulse response can be defined in discrete form using just the sequence $h_k$. Analysis of single-coupled modulation averaging structures in which the ratios between the round trips times of all rings are not always integer multiples, but rather rational numbers, shows that the averaging and reflection properties monotonically vary between those of structures in which the round trip times of all rings (or loops) are integer multiples of the design time. For this reason, the analysis of structures with integer multiples are most instructive to assess the design rules for modulation averaging reflectors.

Modulation averaging works most efficiently when (i) optical signals are intensity modulated at a symbol rate B=1/T greater than that the design symbol rate $B_\xi$ of the modulation averaging reflector and (ii) when the autocorrelation $R(\tau)$ of the intensity modulated signal that is to be averaged is negligible at times equal to the design time $\xi$, namely, $R(\xi) \ll 1$. The second condition (ii) means that the minimum delay increment on the modulation-averaging structure is longer than the correlation time of the input signal. Meeting these two conditions is not required for modulation averaging, but are rather required for efficient averaging: If either one of these conditions are not met, the averaging efficiency will be reduced from what it would be possible for a specific modulation averaging structure/reflector design. For this reason, it is best to make the design time determined by the lowest symbol rate that will be used in the modulation averaging structure.

An ideal optical amplitude modulated signal incident on a modulation reflector is a random bit sequence with two end values, which we set to −1 and 1 with no loss of generality, with symbol rate B=1/T, and infinitely sharp transition edges (infinite bandwidth). We denote this signal with x(t). These end values were selected to be symmetric around zero for convenience; to keep the signal DC balanced and because they result in var(x)=1. The mathematics and physics discussed below do not change if the input signal is offset by a constant or if var(x)≠1, but for simplicity, the formulas below assume a DC balanced signal.

The power-spectral density of the optical intensity x(t) is given by $X(\omega) = 4 \cdot \sin^2(\omega T/2)/\omega^2 T$, as is well known in the art. The transfer function of the modulation-averaging structure is denoted with $H(\omega)$. Using the Wiener-Khinchin theorem, the variance of the output var(y) from the modulation averaging reflector (square of gamma prime) that has signal x incident is given by the integral, $$\gamma'^2 = \frac{\text{var}\, y}{\text{var}\, x} = \frac{\int_0^\infty X(\omega) |H(\omega)|^2 d\omega}{\int_0^\infty X(\omega) d\omega} = \sum_{k=0}^\infty h_k^2 \qquad (6)$$

This analysis is also described in publicly available document by T. Komljenovic, D. Bahić, and Z. Sipus, titled "Modulation Averaging Reflectors for Extended-Cavity Optical Sources", *IEEE J. Lightwave Technology*, vol. 29, p. 2249, 2011. Once this analysis is adopted for two-level signals, it becomes straightforward to extend it to signals of more than two amplitude levels and finite bandwidth. The insertion loss of the modulation averaging reflector is given by $$\Gamma = \sum_{k=1}^\infty h_k \qquad (7)$$
$$\Gamma^2 = |H(0)|^2$$
$$IL[\text{dB}] = -10 \log_{10}(\Gamma)$$

Normalized gamma-prime (NGP) for modulation-averaging structure is given by $$NGP = \left(\frac{\gamma'}{\Gamma}\right) = \frac{\sqrt{\sum_{k=0}^\infty h^2(k)}}{\sum_{k=0}^\infty h(k)}. \qquad (8)$$

Gamma Prime γ' is unity when there is no averaging and decreases as averaging improves. Introducing loss into the structure will reduce γ' and by using NGP we renormalize the figure of merit to exclude the reduction of γ' due to loss. One of key design objectives for modulation averaging structures is to find a topology that yields the lowest NGP with the smallest number of components while it is constructed with practical optical components (i.e., it relies on practically achievable coupling coefficients and loss values) while keeping the insertion loss low. Namely, the design and optimization of modulation averaging structures involves minimizing the variance and maximizing the energy throughput of the structure, $$\sum_{k=0}^\infty h_k^2 \to 0 \text{ and } \sum_{k=0}^\infty h_k \to 1. \qquad (9)$$

It is easy to see that in order to accomplish the requirement (9) one should make the impulse response of the modulation averaging reflector as long as possible and have as many impulses fill the entire time of the impulse response. The key modulation-averaging structure specifications include (i) operating wavelength range (upstream band from FIG. 2), (ii) the symbol rate range, (iii) modulation averaging requirement (normalized gamma), and (iv) size/cost of the structure. These specifications will control the choice of technology, materials, and the architecture of the modulation averaging structure. Specific approaches to achieving this type of response and modulation-averaging structures that accomplish this are disclosed below.

In one embodiment, modulation averaging structure utilizes optical fibers. Said optical fibers may be standard silica optical fibers, polarization maintaining fibers, or polymer optical fibers (POF). In another embodiment, the modulation averaging structure is disposed on a planar lightwave circuit.

There are two sources of optical loss: optical coupler and waveguide attenuation. When optical fiber and optical fiber-coupler are used, the fiber attenuation is lower than the optical coupler loss, hence minimizing the number of couplers is more important than reducing the length of the fiber used in the entire structure. In structures where the waveguide loss or waveguide cost is an issue, the length of the waveguide (or fiber) should be minimized.

Single-Coupled Ring Modulation-Averaging Structures

FIG. 6A shows an exemplary topology of one embodiment of a modulation averaging component. A two-port modulation averaging structure 600 comprises a central waveguide 601 and at least one waveguide ring 602 coupled to central waveguide 601 in one place using a four-port optical coupler 605. Modulation-averaging structure 600 is unidirectional. When a multiplicity of rings is present, as is also shown in the example in FIG. 5, the structure 600 is referred to as a cascade of single-coupled rings. FIG. 6A shows an example where three waveguide rings 602, 603, and 604, are coupled to said central waveguide 601 using three four-port optical couplers 605, 606, and 607. An optical signal incident on port 1 has an infinite number of ways to get to port 2 (and vice versa). At the exit (port 2, for example) the delay between each and every one of the infinite number of different paths (measured from the signal entry at port 1) is an integer multiple of the design time ξ, provided that the round-trip times in each of the three rings are an integer multiple of the design time ξ. In so designed structure, an optical signal exhibiting intensity modulation entering at port 1 emanates averaged at port 2. If port 2 is terminated with a high-reflectivity mirror, the signal returning to port 1 will be averaged. This structure also averages intensity modulation at symbol durations other than design time ξ. This embodiment has a planar topology and can be manufactured on a planar lightwave circuit chip. The manufacturing process for this structure may involve providing n optical couplers and then connecting them to form the desired topology shown in FIG. 6A.

The impulse response of a single-coupled ring segment j in the frequency domain can be derived in a straightforward fashion and is given by, $$H_j(\omega) = \frac{t_j - (t_j^2 - \kappa_j^2)\exp(-i\omega m_j \xi)}{1 - t_j \exp(-i\omega m_j \xi)} \quad (10)$$

where κ and t are the coupling and the transmission coefficients of the optical coupler and the $m_j\xi$ round-trip time of waveguide ring in segment j. A modulation averaging reflector formed using the three single-coupled ring structure shown in FIG. 6A and a fiber mirror with optical power reflectivity $r_f$ terminating port 2 can be written as a product of individual sections $H_{MAR}(\omega)=r_f H_1^2(\omega) H_2^2(\omega) H_3^2(\omega)$. The reason for the square on each of the individual transfer functions is that the optical wave traverses each of the rings twice, once before and once after being reflected on the mirror $r_f$. By numerically evaluating the variance of the modulation-averaging reflector (MAR) response to a PAM-2 signal, one can obtain optimal combinations of individual coupling and transmission coefficients and the round-trip times for the three rings.

FIG. 6B shows an exemplary topology of another embodiment of a modulation averaging component. A two-port modulation averaging structure 620 comprises a central waveguide 621 coupled to itself in at least one place using a four-port optical coupler 625 to form at least one loop. Modulation-averaging structure 620 is unidirectional. When a multiplicity of loops is present, as is shown the example in FIG. 6B, the structure 620 is referred to as a cascade of single-coupled loops, while if only one loop is present, the structure is referred to as a single-coupled loop. FIG. 6B shows an example where three waveguide loops 622, 623, and 624, are coupled to said central waveguide 621 using three four-port optical couplers 625, 626, and 627. An optical signal incident on port 1 has an infinite number of ways to get to port 2 (and vice versa). At the exit (port 2, for example) the delay between each and every one of the infinite number of different paths (measured from the signal entry at port 1) is an integer multiple of the design time ξ, provided that the round-trip times in each of the three rings are an integer multiple of the design time ξ. In so designed structure, an optical signal exhibiting intensity modulation entering at port 1 emanates averaged at port 2. If port 2 is terminated with a high-reflectivity mirror, the signal returning to port 1 will be averaged. This structure also averages intensity modulation at symbol durations other than design time ξ. This embodiment does not have planar topology and can be manufactured from a single strain of optical fiber: The manufacturing process for this structure may involve providing a single optical fiber and then forming n optical couplers to form the topology shown in FIG. 6B. For this reason, the structure shown in FIG. 6B is said to have a contiguous topology: it can be made from a single fiber. Using same terminology, the topology shown in FIG. 6A is non-contiguous.

It is clear that the performance of two above-disclosed embodiments (illustrated with FIGS. 6A and 6B) can be mathematically analyzed identically by exchanging the optical-coupler transmission t and coupling κ coefficients. For this reason, the embodiment illustrated with FIG. 6A can be implemented in place of the embodiment illustrated with FIG. 6B without departing from the spirit of the invention.

Lowest NGP Using Non-Overlapping Impulse Responses

Figure 7A:
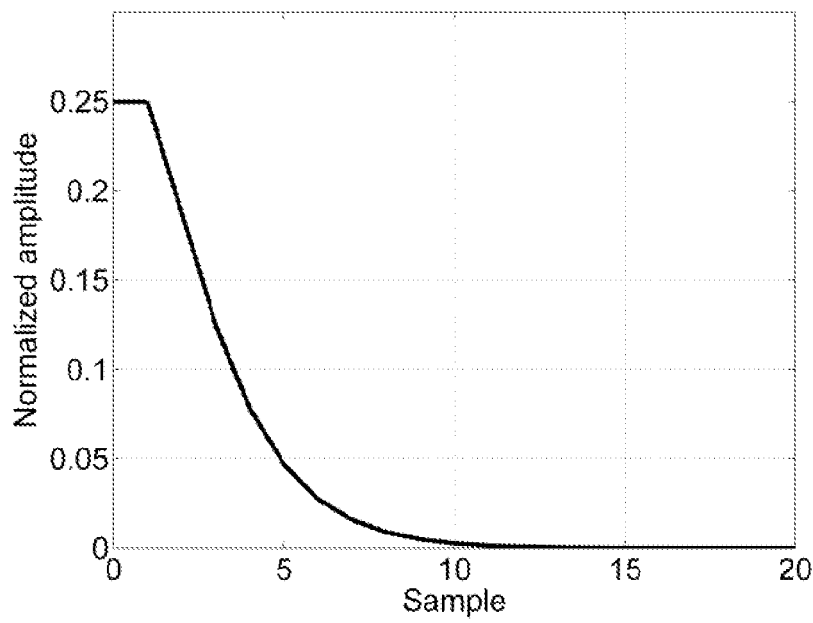
FIG. 7A: Impulse response of lossless single-coupled ring with two elements where the round-trip of the one ring equals to the design length $L_g$; the coupling coefficient is equal to 50%.
Figure 7B:
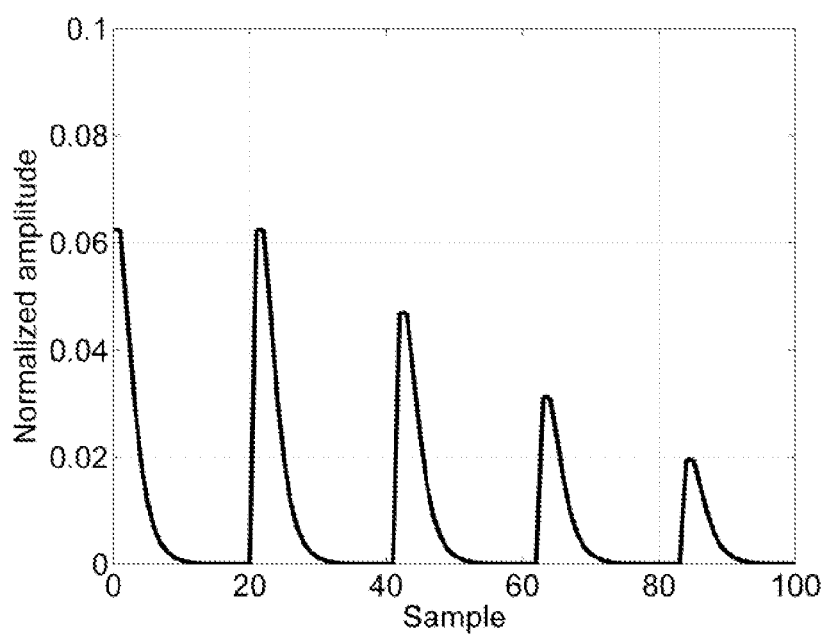
FIG. 7B: Impulse response of lossless single-coupled ring with two elements where the round-trip of the first ring equals the design length $L_g$; while the other ring has a round-trip length equal to $21L_g$; the coupling coefficient is equal to 50% for both rings.

One approach to minimizing the variance of an n-ring modulation averaging reflector is to ensure that the impulse responses of any of the rings do not overlap. In this way, one effectively makes the impulse response long and each of the impulses within that response of comparable magnitude satisfying the optimization requirement of (9). This requirement is illustrated with the help of FIGS. 7A and 7B. An exemplary impulse response of a single-ring ($m_1$=1) structure is illustrated in FIG. 7A. If one adds one more ring to this first single ring in a cascade, but makes the round-trip time ($m_2$) of the second ring much larger than $m_1$, i.e., $m_2 \gg m_1$, the impulse responses of the two rings will not overlap. FIG. 7B shows the impulse response of the single-coupled ring cascade of two rings with $m_1$=1 and $m_2$=21. Clearly, the impulse responses do not overlap since the $m_1$ ring decays substantially before the first pulse of the $m_2$ ring brings the delayed impulse response of the first ring back. These non-overlapping conditions offer the lowest possible gamma prime for any n-ring modulation averaging reflector with unit reflectivity and no loss. The minimum gamma prime for an n-ring (or loop) structure is given with $$NGP_{min} = \prod_{j=1}^{n} \beta_j(t_j, \kappa_j) \quad (11)$$

where subscript j refers to each ring and in expression (11) all the rings are assumed to be different. For each ring, the factor $\beta_j$ is the lowest possible NGP for a single segment (with one ring) given with, $$\beta(t, \kappa) = \left(\frac{1-t}{t+\kappa^2-t^2}\right)^2 \sqrt{(t^2-\kappa^2)^2 + \frac{2(t^2-\kappa^2)(1+\kappa^2-t^2)\kappa^2}{(1-t^2)} + \frac{(1+\kappa^2-t^2)^2\kappa^4}{(1-t^2)^3}} \quad (12)$$

Figure 10:
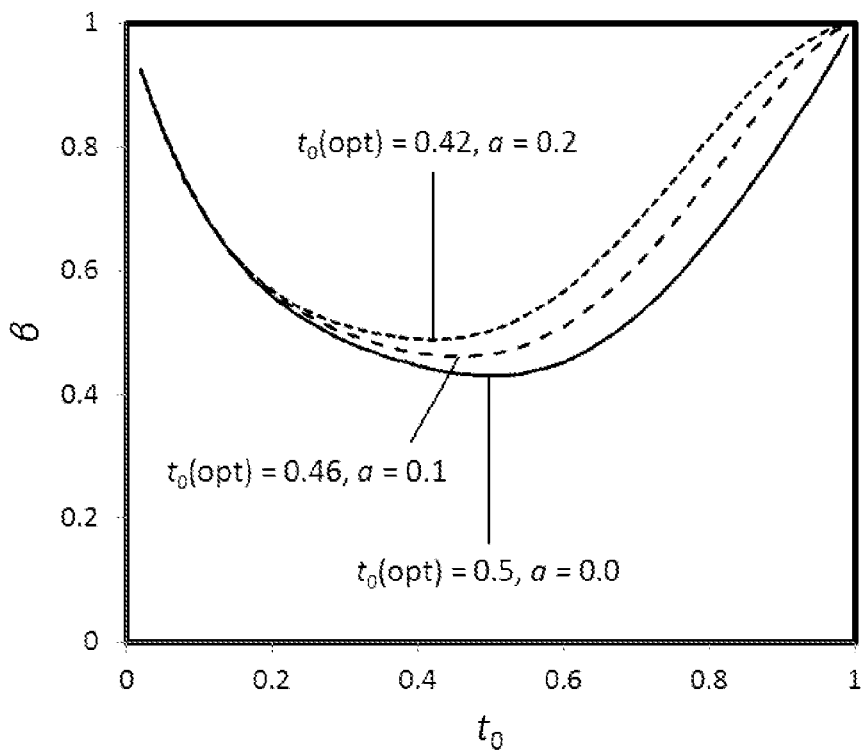
FIG. 10: Single-coupled loop segment NGP contribution (referred to as $\beta$) versus coupling coefficient and coupler loss.

The coupling coefficient that gives minimum $\beta_j$ and thus the minimum gamma prime in equation (11) depends on coupler loss a. Expression (12) is plotted in FIG. 10 illustrating the dependence for three values of a=0.0, 0.1, and 0.2. When the couplers are lossless, the optimal value of $\kappa=\kappa_0=t=t_0=\frac{1}{2}$ while the gamma prime is equal to $\beta=\sqrt{5.27}$. When the coupler losses increase the optimal transmission coefficient $t_0$ (opt) reduces approximately as $t_0(opt) \approx (1-a)(1+a^{3/2}/2)/2$, also shown in FIG. 10. Note that the actual transmission and coupling coefficients are given as $t=t_0(1-a)$ and $\kappa=(1-t_0)(1-a)$. If all couplers are identical, the minimum NGP is given by $$NGP = \beta^n. \quad (13)$$

This method of optimization can be expressed as follows: a n-ring (or loop) modulation averaging reflector will exhibit optimal modulation averaging (lowest gamma prime) when the coupling coefficient of all the optical couplers is set to $t_{opt}$ and the round-trip times of the rings ($m_1:m_2:m_3: \ldots m_n$) are $m_1 \ll m_2 \ll m_3 \ll \ldots \ll m_n$, with no loss of generality (the order is immaterial). For no loss optical coupler, $t_{opt}=0.5$, while for couplers with loss, the optimal value can be read from FIG. 10 or the formula given in previous paragraph. In practice, for lossless MAR making the ratio between adjacent-ring round-trip sizes at least seven (7) times will saturate the normalized gamma prime in this method of optimization. For a 3-ring modulation averaging reflector with unit reflectivity and no loss, the minimum value obtained from equation (11) is $NGP_{min}$ (n=3)=0.079691. In practice the coupling coefficient fluctuates due to manufacturing tolerances and in most cases it is more useful to use identical couplers to create a practical design. In one embodiment, the coupling coefficient of each of the optical couplers in a single-coupled ring modulation averaging structure ranges between 40% and 60%. In yet another embodiment, the coupling coefficients of all optical couplers in a single-coupled ring modulation averaging structures are substantially equal to 50%.

FIG. 10 illustrates the optical-coupling-coefficient dependence of NGP for a single-ring (loop) referred to as β. Since the minimum NGP is given as a power of via equation (13), it is clear that using near 50% transmission and low loss is essential for achieving high modulation averaging performance with single-coupled loop/ring structures.

Figure 11:
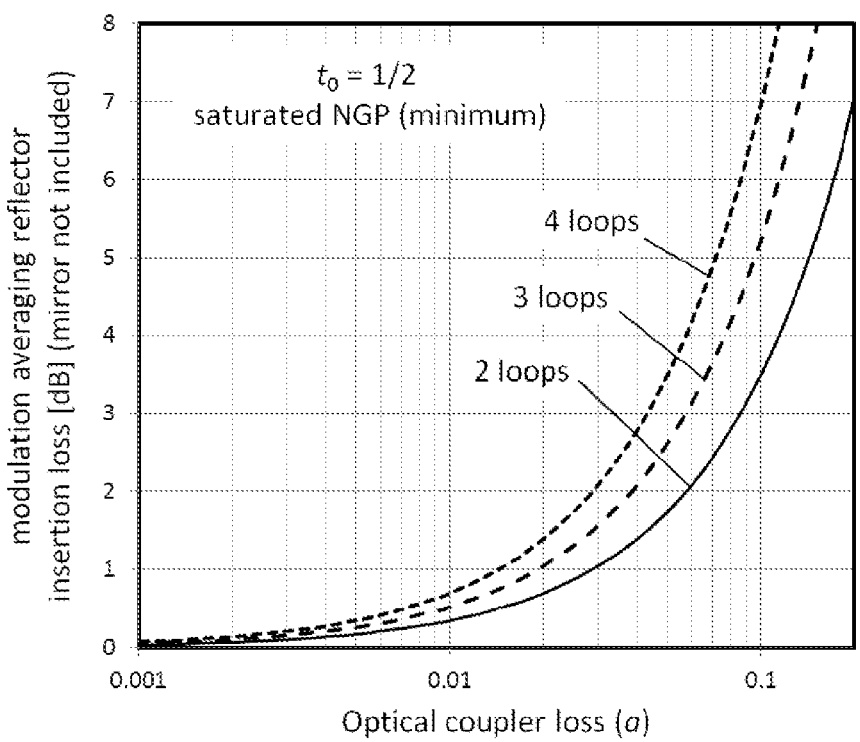
FIG. 11: Insertion loss of singe-coupled loop modulation averaging reflector not including the mirror loss for a cascade with two, three, and four loops. The optical coupling coefficient is fixed at 50%.

FIG. 11 illustrates the minimum achievable insertion loss for 2, 3, and 4 loop structures as a function of the optical coupler loss a. Clearly, low loss couplers should be used.

Lowest NGP by Using Round-Trip Times with No Common Factors

If it is necessary to maintain the total length of the waveguides specified to minimize the waveguide loss or waveguide cost, the minimization criterion is, $$\xi \sum_{j=1}^{n} m_j = \text{waveguide length} \quad (14)$$

$$M = \sum_{j=1}^{n} m_j$$

Figure 8:
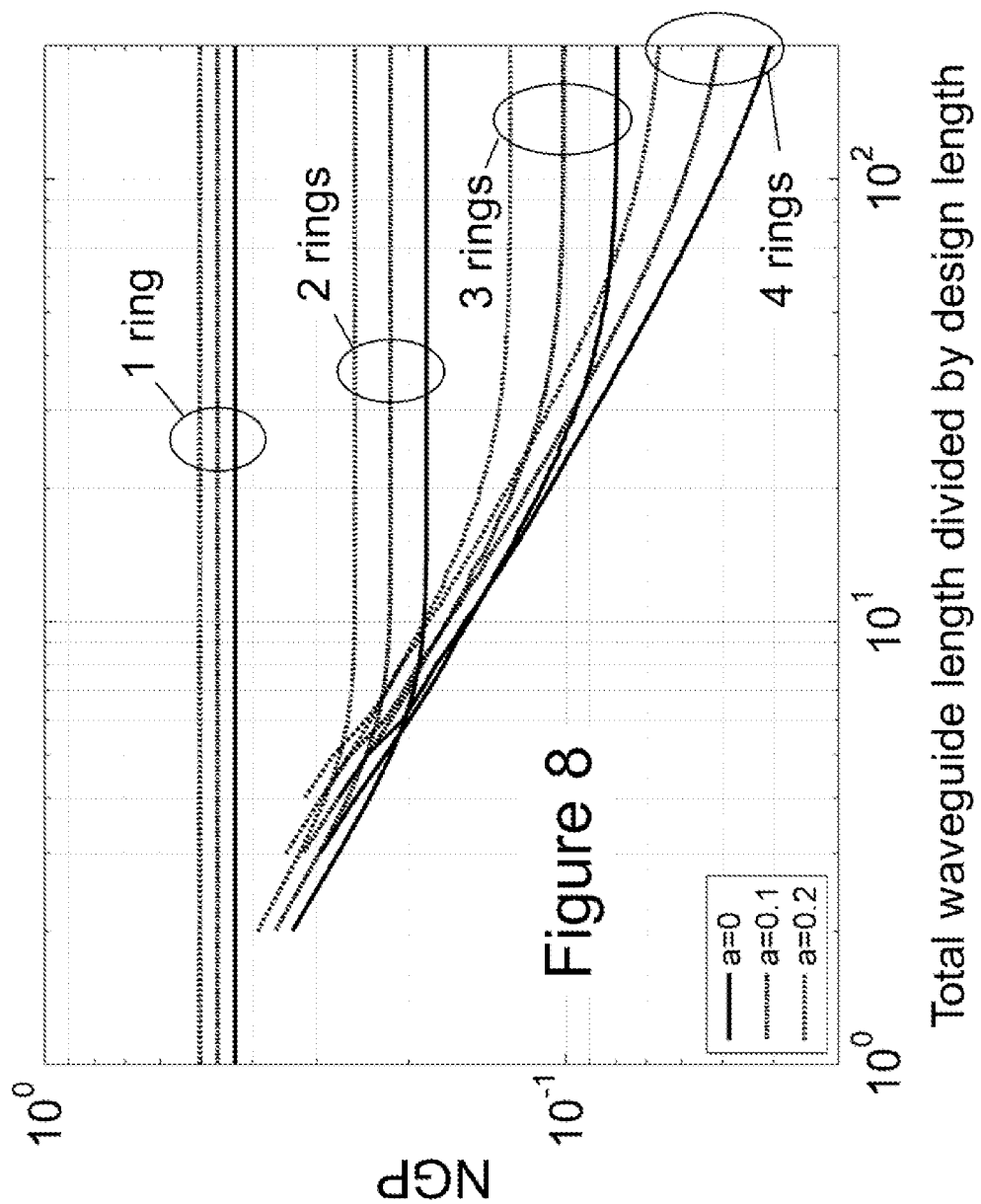
FIG. 8: Minimum NGP (normalized gamma prime) versus total waveguide length divided by design length for 1, 2, 3, and 4-ring modulation averaging reflector with optical coupler loss a values equal to 0, 10%, and 20%. Numerical data for a portion of the 3-ring graph in this figure is given in FIG. 12.

The goal is to achieve minimum normalized gamma prime for a given total length of waveguide. This problem involves at least 2n degrees of freedom: there are n optical coupling coefficients $\kappa_j$ (one at each of n couplers) and n ring (loop) round trip times $m_j$ (a different one at each of n couplers) to be adjusted. The necessary conditions for obtaining the minimal value of normalized gamma prime is that the round trip times $m_j$ have no common factors, namely, the greatest common divisor of the round-trip time multiplier $m_1$ has to be unity: $GCD(m_1, m_2, \ldots m_n)=1$. This condition, however, is not sufficient. There is more than one combination of $m_i$'s that lead to low and minimal value of normalized gamma prime (NGP) and many combinations bring NGP values so close to the minimum that the difference bears almost no practical significance. FIG. 12 shows a listing of loop perimeter multipliers $m_1$, $m_2$, and $m_3$ for 3-loop modulation averaging reflector that result in lowest NGP. This data is a numerical listing of the structures used to obtain the graph in FIG. 8. There are multiple combinations of $m_j$ that produce modulation-averaging structures and reflectors with very low NGP that differ very little so the suggested combinations of $m_j$ shown in FIG. 12 are not all of the values that may in practice produce an excellent modulation averaging reflector. The list of values provided in FIG. 12 is given to assist the designer to arrive at an optimal structure in a straightforward manner without having to optimize the structure. Finding and selecting other values that result in the lowest NGP does not depart from the spirit of the invention.

Furthermore, using rational or real numbers for the round-trip multipliers $m_j$ does not depart from the invention. As it was indicated at the top, using integer $m_j$'s was used for the purpose of teaching the design, but it is clear that any set of real numbers may be used to optimize the NGP.

It has been observed in the numerical optimizations that for every M, there are multiple solutions depending on the $m_j$ sequence and for which the optical coupling $\kappa_i$ also may be optimized for each coupler. For these solutions we find that the optical coupling coefficients vary but are localized around the central value of 50% and substantially between 40% and 60%.

Inasmuch as there is a clear advantage in building modulation averaging reflectors by using optical couplers with identical optical coupling coefficient, selecting a nominal optical coupling coefficient equal to 50%, leaves one only n degrees of freedom: the varying round-trip times which are already restricted with not having any common factors (GCD=1).

The averaging capability (expressed in NGP) of a modulation averaging reflector based on single-coupled rings (or loops) saturates with the total length M of the waveguides as was discussed in section on non-overlapping impulses and the lowest NGP value is expressed with equation (13) with β given by (12). For finite M, the combination of $m_i$'s that yields minimum NGP depends on a solution of series of n-th order linear diophantine equations. This solution is not possible to write in closed form and either has to be computed from the impulse response using known techniques of Fourier transform or computed numerically for the whole structure employing global optimization techniques. For a 3-ring structure, the limited list of combination yielding lowest or close to lowest NGP is tabulated in FIG. 12.

The numerical simulations and data shown in FIG. 12 shows that very loss NGP can be obtained even without keeping the ratio of perimeters between the loops at least seven (7) as indicated in previous section. The data shows that when GCD is kept at unity and loop perimeters optimized, that very low values of NGP can be achieved of the ratio is greater than two (2)—see, for example, length 88 in FIG. 12 where the ratio is greater than 5/2 (=2.5) for a reasonably high loss of a=10%. However, it is clear from FIG. 12 and other simulations, a vast majority of optimal designs have the ratio between any two loops greater than three (3). Hence, in one embodiment a connected optical waveguide structure comprises n four-port optical couplers, said n greater than one; n waveguide loops, each loop having a perimeter; wherein a ratio of perimeters of any two of said n loops is greater than 5/2. In yet another embodiment, said ratio of perimeters of any two of said n loops is greater than three (3).

The optimal transmission and coupling coefficients vary for each combination of m, n, and k, but since absorptance is generally very small in good quality fiber-optic couplers ($\alpha<0.1$) and increment in nominal optical coupler coupling coefficients of commercially available couplers around 50% is 10%, keeping $t=\kappa=\frac{1}{2}$ is generally sufficient to realize a practical modulation averaging 3-ring reflector.

Polarization Control

In a single-coupled ring modulation averaging reflector and any other embodiment of a coupler-based modulation averaging structure, at every optical coupler signals arriving from any of two waveguide segments are split into two other waveguide segments. In one embodiment, the polarization of the optical waves is maintained within said optical couplers and waveguide segments so that the polarization of the optical signal returned from such a modulation averaging reflector (or structure) is equal to the polarization of the launched signal. This type of modulation averaging structure is built using polarization maintaining waveguides and polarization maintaining optical couplers. Such modulation averaging reflectors are referred to as polarization maintaining or polarization preserving modulation averaging structures or reflectors. This embodiment is explained with the help of FIG. 9A which illustrates a segment of a single-coupled ring modulation-averaging structure 900. An n-ring single-coupled MAR is built by a cascading such sections, connecting the parts together (ports 1 and 2 shown in the figure). A section of polarization maintaining MAR 900 comprises of a central waveguide 901 to which a ring 902 is optically coupled in one place using a polarization maintaining optical coupler 905. An optical wave with direction polarization pointing out of the page, illustratively shown with arrow 910 is incident from Port 1. A portion of the optical power is passed through the optical coupler 905 with unchanged polarization 907, while fraction of the power is coupled into the ring (or loop) 902. The polarization direction 912 of the optical signal inserted into the ring (or loop) is maintained while the signal propagated on the perimeter of the loop 902 up to entering the polarization maintaining optical coupler 905 as indicated with arrow 911. In this manner, the fraction returning to the central waveguide 901 from the loop 902 has the same polarization as the incident optical signal 910.

In another embodiment, the polarization of the optical waves is purposely randomized within said optical couplers and waveguide segments as shown by a section of polarization scrambling MAR 950. This is realized by rotating the waveguides in each of the loops to return to the optical coupler polarization that is angled relative to the polarization of the wave that was launched into the same loop.

This embodiment is described with the help of FIG. 9B. An optical wave with direction polarization pointing out of the page, illustratively shown with arrow 960 is incident from Port 1. A portion of the optical power incident on Port 1 transverses through central waveguide 951 and is passed through the optical coupler 955 with unchanged polarization 957 an it reaches port 2, while fraction of the power is coupled into the ring (or loop) 952. The polarization direction 962 of the optical signal inserted into the ring (or loop) 952 is maintained while the signal propagated on the perimeter of the loop 952 up to entering the polarization maintaining optical coupler 955. Prior to entering the optical coupler 955, the polarization of the waveguide is turned so that the polarization of the signal returning from the loop (or ring) 952 indicated with arrow 961 is perpendicular to the polarization of the wave arriving from along the central waveguide whose polarization direction is shown with 960. The result of this arrangement is that the outgoing optical signal contains copies of itself, but with orthogonal polarizations as indicated with arrows 957. In this way, the modulation averaging reflector randomizes the polarization and is referred to as a depolarizing modulation-averaging reflector (or structure).

This feature is set at the manufacturing time and may use standard optical fiber or waveguides or may use polarization maintaining waveguides and intentionally rotating the polarization within the loops. The resulting modulation averaging reflector is a depolarizing modulation averaging structure.

In embodiment illustrated in FIG. 4A the network architecture uses a depolarizing (or polarization scrambling) modulation-averaging reflector. In yet another embodiment, the network architecture shown in FIG. 4B uses a polarization maintaining (or preserving) modulation-averaging reflector.

Other Embodiments

It is clear to a person skilled in the art in optical waveguides that modulation averaging with arbitrarily low NGP may be achieved using optical loops optically coupled to central waveguide or to themselves which split the optical signal and allow any number of delayed versions of the input optical signal to add before leaving the optical structure will result in. In other words, similar NGP values as shown in the above embodiments can be achieved with more couplers or longer waveguides. In one embodiment, a connected optical waveguide structure comprises n four-port optical couplers, said n greater than two; n waveguide loops, each loop having a perimeter; wherein a ratio of perimeters of any two of said n loops is greater than one.

It is clear to a person skilled in the art that any embodiment disclosed herein may be combined with any other embodiment disclosed in this application to optimize or adopt the inventions to their specific purpose. When singular is used, plural is possible without departing from the spirit of the invention.

The invention claimed is:

1. A connected optical waveguide structure comprising:
   n four-port optical couplers, where n is greater than one; and
   n waveguide loops, each loop having a corresponding perimeter;
   wherein each of the n perimeters is different from each of the other n−1 perimeters;
   wherein for any pair of the n loops, the ratio of the larger perimeter to the smaller perimeter is greater than five halves (5/2); and
   wherein the optical waveguide structure is further described as having a design length, wherein a sequence of each of the n perimeters divided by the design length is a sequence of n integers with greatest common divisor equal to unity.

2. A connected optical waveguide structure comprising:
   n four-port optical couplers, where n is greater than one; and
   n waveguide loops, each loop having a corresponding perimeter;
   wherein each of the n perimeters is different from each of the other n−1 perimeters;
   wherein for any pair of the n loops, the ratio of the larger perimeter to the smaller perimeter is greater than five halves (5/2); and
   wherein a sequence of each of the n perimeters divided by the smallest of the n perimeters is a sequence of n integers with greatest common divisor equal to unity.

3. A connected optical waveguide structure comprising:
   n four-port optical couplers, where n is greater than one; and
   n waveguide loops, each loop having a corresponding perimeter;

wherein each of the n perimeters is different from each of the other n−1 perimeters;

wherein for any pair of the n loops, the ratio of the larger perimeter to the smaller perimeter is greater than five halves (5/2);

wherein the optical waveguide structure further comprises a high reflectivity waveguide mirror optically connected to one of the n optical couplers;

wherein the coupling coefficients of all of the n optical couplers are greater than 40% and less than 60%; and wherein all of the n waveguide loops and all of the n optical couplers are polarization maintaining.

4. An optical waveguide structure comprising an array of n optical couplers, each of the n optical couplers having four ports numbered so that within each of the optical couplers optical signals are electromagnetically coupled between ports of different parity;

a waveguide mirror terminating one port of one of the n optical couplers;

n optical waveguide loops, each of the n loops comprising a segment of an optical waveguide connected between two ports of different parity on a corresponding one of the n optical couplers, and each of the n loops having a different round-trip time;

wherein the greatest common divisor of any one round-trip time normalized to the shortest round-trip time rounded to nearest integer equals unity.

5. Optical waveguide structure of claim 4, wherein the coupling coefficients of all of the n optical couplers are greater than 40% and less than 60%.

6. Optical waveguide structure of claim 5, wherein the coupling coefficients of all the n optical couplers are substantially equal to 50%.

7. Optical waveguide structures of claim 5, wherein all of the n optical couplers and all of the n waveguide loops are polarization maintaining.

8. A wavelength-division multiplexer optical source comprising an array waveguide grating having m distribution ports and at least one common port;

at least one segment of distribution fiber connected to at least one of the m distribution ports;

at least one optical transceiver connected to the at least one segment of distribution fiber; and a self-seeding optical component comprising n optical couplers and n−1 waveguide loops, each loop having a perimeter different from the perimeter of each of the other n−2 loops, a ratio of the larger perimeter to the smaller perimeter of any pair of the n−1 loops being greater than five halves (5/2), and n being at least three;

wherein the self-seeding optical component is connected to the common port of the array waveguide grating.

9. Wavelength-division multiplexer optical source of claim 8, wherein the self-seeding optical component further comprises a 45-degree Faraday rotator connected to one of the n optical couplers.

* * * * *